US010453519B2

(12) United States Patent
Sawada et al.

(10) Patent No.: US 10,453,519 B2
(45) Date of Patent: *Oct. 22, 2019

(54) SEMICONDUCTOR DEVICE

(71) Applicant: Renesas Electronics Corporation, Tokyo (JP)

(72) Inventors: Yohei Sawada, Tokyo (JP); Makoto Yabuuchi, Tokyo (JP); Yuichiro Ishii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/143,940

(22) Filed: Sep. 27, 2018

(65) Prior Publication Data
US 2019/0027212 A1      Jan. 24, 2019

Related U.S. Application Data

(63) Continuation of application No. 15/513,138, filed as application No. PCT/JP2015/060133 on Mar. 31, 2015, now Pat. No. 10,102,899.

(51) Int. Cl.
*G11C 11/417*       (2006.01)
*G11C 11/41*        (2006.01)
(Continued)

(52) U.S. Cl.
CPC ............ *G11C 11/417* (2013.01); *G11C 11/41* (2013.01); *G11C 11/412* (2013.01); *G11C 11/413* (2013.01); *G11C 5/148* (2013.01)

(58) Field of Classification Search
CPC .................................................. G11C 11/417
(Continued)

(56) References Cited

U.S. PATENT DOCUMENTS 6,344,992 B1 *   2/2002   Nakamura ............. G11C 5/147
                                                             365/154
6,999,338 B1     2/2006   Hirabayashi
(Continued)

FOREIGN PATENT DOCUMENTS

JP      2004-206745 A    7/2004
JP      2007-150761 A    6/2007
(Continued)

OTHER PUBLICATIONS

United States Notice of Allowance dated Jun. 8, 2018, in U.S. Appl. No. 15/513,138.
(Continued)

*Primary Examiner* — Huan Hoang
*Assistant Examiner* — Muna A Techane
(74) *Attorney, Agent, or Firm* — McGinn I.P. Law Group, PLLC.

(57) ABSTRACT

A semiconductor device includes a SRAM (Static Random Access Memory) circuit. The SRAM circuit includes a static memory cell, a word line coupled with the static memory cell, a pair of bit lines coupled with the static memory cell, a first interconnection coupled with the static memory cell, and supplying a first potential, a second interconnection coupled with the static memory cell, and supplying a second potential lower than the first potential, a first potential control circuit controlling a potential of the second interconnection, and a second potential control circuit controlling a potential of the first interconnection. The SRAM circuit includes, as an operation mode a first operation mode for reading data from the SRAM circuit, or for writing data into the SRAM circuit, and a second operation mode for reducing power consumption than the first operation mode.

8 Claims, 21 Drawing Sheets

(51) Int. Cl.
    *G11C 11/412*     (2006.01)
    *G11C 11/413*     (2006.01)
    *G11C 5/14*     (2006.01)

(58) Field of Classification Search
    USPC .................................................... 365/72, 75
    See application file for complete search history.

(56) References Cited

U.S. PATENT DOCUMENTS

| | | |
|---|---|---|
| 8,018,780 B2 | 9/2011 | Houston et al. |
| 8,406,075 B2 | 3/2013 | Lee et al. |
| 2004/0125681 A1 | 7/2004 | Yamaoka et al. |
| 2007/0121358 A1 | 5/2007 | Hirota et al. |
| 2007/0211545 A1* | 9/2007 | Otsuka .................. G11C 5/148 365/189.09 |
| 2008/0151606 A1 | 6/2008 | Kurumada et al. |
| 2009/0174000 A1 | 7/2009 | Ohguro |
| 2010/0232244 A1* | 9/2010 | Hirabayashi ............ G11C 7/12 365/208 |
| 2011/0031552 A1 | 2/2011 | Iwamatsu et al. |
| 2014/0036612 A1 | 8/2012 | Takagi et al. |
| 2013/0077387 A1 | 3/2013 | Yabuuchi |
| 2014/0119103 A1 | 5/2014 | Lee et al. |
| 2016/0049395 A1 | 2/2016 | Okagaki et al. |

FOREIGN PATENT DOCUMENTS

| | | |
|---|---|---|
| JP | 2007-250586 A | 9/2007 |
| JP | 2009-158711 A | 7/2009 |
| JP | 2011-040458 A | 2/2011 |
| JP | 2011-091324 A | 5/2011 |
| JP | 2012-175012 A | 9/2012 |
| JP | 2013-254548 A | 12/2013 |

OTHER PUBLICATIONS

United States Office Action dated Dec. 14, 2017, in U.S. Appl. No. 15/513,138.

International Search Report (ISR) (PCT Form PCT/ISA/2010), in PCT/JP2015/060133, dated May 12, 2015.

Japanese Office Action dated Jun. 19, 2018 in corresponding Japanese Application No. 2017-247938 with an English translation thereof.

Japanese Office Action dated Oct. 3, 2017 in Japanese Application No. 2017-508925 with an English translation thereof.

Japanese Office Action, dated Jun. 4, 2019, in Japanese Patent Application No. 2018-181211 and English Translation thereoff.

* cited by examiner

SEMICONDUCTOR DEVICE

The present application is a Continuation Application of U.S. patent application Ser. No. 15/513,138, filed on Mar. 21, 2017, which is based on and claims priority from International Application No. PCT/JP2015/060133, filed on Mar. 31, 2015, the entire contents of which are incorporated herein by reference.

TECHNICAL FIELD

The present invention relates to semiconductor devices, and is suitably used, for example, for a semiconductor device including a SRAM (Static Random Access Memory) circuit.

BACKGROUND ART

In order to reduce a leakage current during standby of a SRAM circuit, it is effective to set the potential of a ground interconnection of a memory array at a potential higher than a ground potential (0V) (a potential between a power supply potential and the ground potential). This can reduce a sub-threshold leakage current of a MOS (Metal Oxide Semiconductor) transistor in an OFF state which forms a memory cell.

In Japanese Patent Laying-Open No. 2004-206745 (PTD 1), for example, a potential control circuit for controlling the potential of a ground interconnection is provided to thereby control the potential of the ground interconnection during standby at about 0.4V. Specifically, this potential control circuit is formed of three elements, namely, a switch for fixing the potential of the ground interconnection at a ground potential during operation, a diode-connected NMOS (N-channel MOS) transistor for determining the potential of the ground interconnection during standby, and a resistance for continuously passing a current.

CITATION LIST

Patent Document

PTD 1: Japanese Patent Laying-Open No. 2004-206745

SUMMARY OF INVENTION

Technical Problem

In a MOS transistor manufactured with a conventional process, a PMOS (P-channel MOS) transistor has a smaller leakage current than that of an NMOS transistor. Thus, in order to address a leakage current of a SRAM circuit, only a leakage current of an NMOS transistor forming a memory cell needed to be considered.

In the recent processes, however, with improved performance of a PMOS transistor, the potential of a ground interconnection during standby may rise above an expected level due to a leakage current of a PMOS transistor. The above problem is more serious in the state-of-the-art processes using finFETs (fin Field Effect Transistors) due to greater global variation than in conventional processes. Specifically, when an NMOS transistor has characteristics in a slow corner where a drain current is small and a PMOS transistor has characteristics in a fast corner where the drain current is large, there is a particularly great amount of the rise of the potential of the ground interconnection during standby, which may result in destruction of data held in each memory cell of a SRAM circuit.

The other problems and new features will become apparent from the description of the present specification and the accompanying drawings.

Solution to Problem

In a semiconductor device according to one embodiment, a SRAM circuit includes a ground interconnection potential control circuit for controlling a potential of a ground interconnection for a memory array depending on an operation mode. This ground interconnection potential control circuit includes an NMOS transistor and a PMOS transistor connected in parallel to each other between the ground interconnection and a ground node providing a ground potential.

Advantageous Effects of Invention

According to the above embodiment, an excessive rise of the potential of the ground interconnection in a standby state of the SRAM circuit can be prevented.

DESCRIPTION OF EMBODIMENTS

Embodiments will be described below in detail with reference to the drawings. The same or corresponding parts are designated by the same reference signs and will not be described repeatedly.

<First Embodiment>

[Configuration Example of Semiconductor Device]

Figure 1:
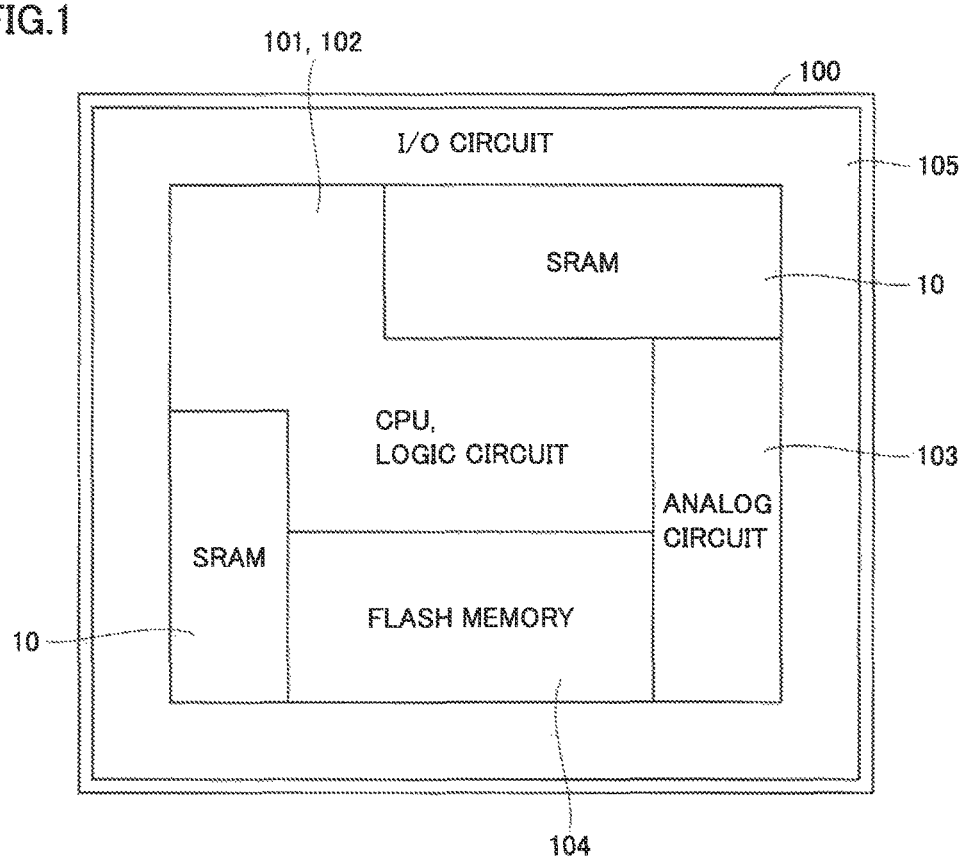
FIG. 1 is a plan view generally showing a microcomputer configured as a system-on-chip, as an example semiconductor device according to a first embodiment.

FIG. 1 is a plan view generally showing a microcomputer configured as a system-on-chip, as an example semiconductor device according to a first embodiment. With reference to FIG. 1, the microcomputer chip includes a CPU (Central Processing Unit) 101, a digital logic circuit 102, a SRAM circuit 10, a flash memory 104, an analog circuit 103, and an I/O (Input/Output) circuit 105, which are formed on a semiconductor substrate 100.

Digital logic circuit 102 includes, for example, a peripheral logic circuit of CPU 101 and a dedicated signal processing circuit. SRAM circuit 10 is used as an internal RAM (Random Access Memory), and flash memory 104 is used as an internal ROM (Read Only Memory). Analog circuit 103 includes, for example, an A/D (Analog to Digital) converter and a D/A (Digital to Analog) converter. Input/output circuit 105 serves as an interface for inputting/outputting signals from/to the outside.

SRAM circuit 10 includes, as operation modes, a normal operation (NOP) mode, a resume standby (RS) mode, and a shutdown (SD) mode. The normal operation mode is an operation mode for reading and writing data. The resume standby mode is an operation mode for reducing power consumption while holding the written data. The shutdown mode is an operation mode for stopping the functions without holding the written data. In the following, the resume standby mode may be abbreviated as a standby mode.

[Configuration of SRAM Circuit]

Figure 2:
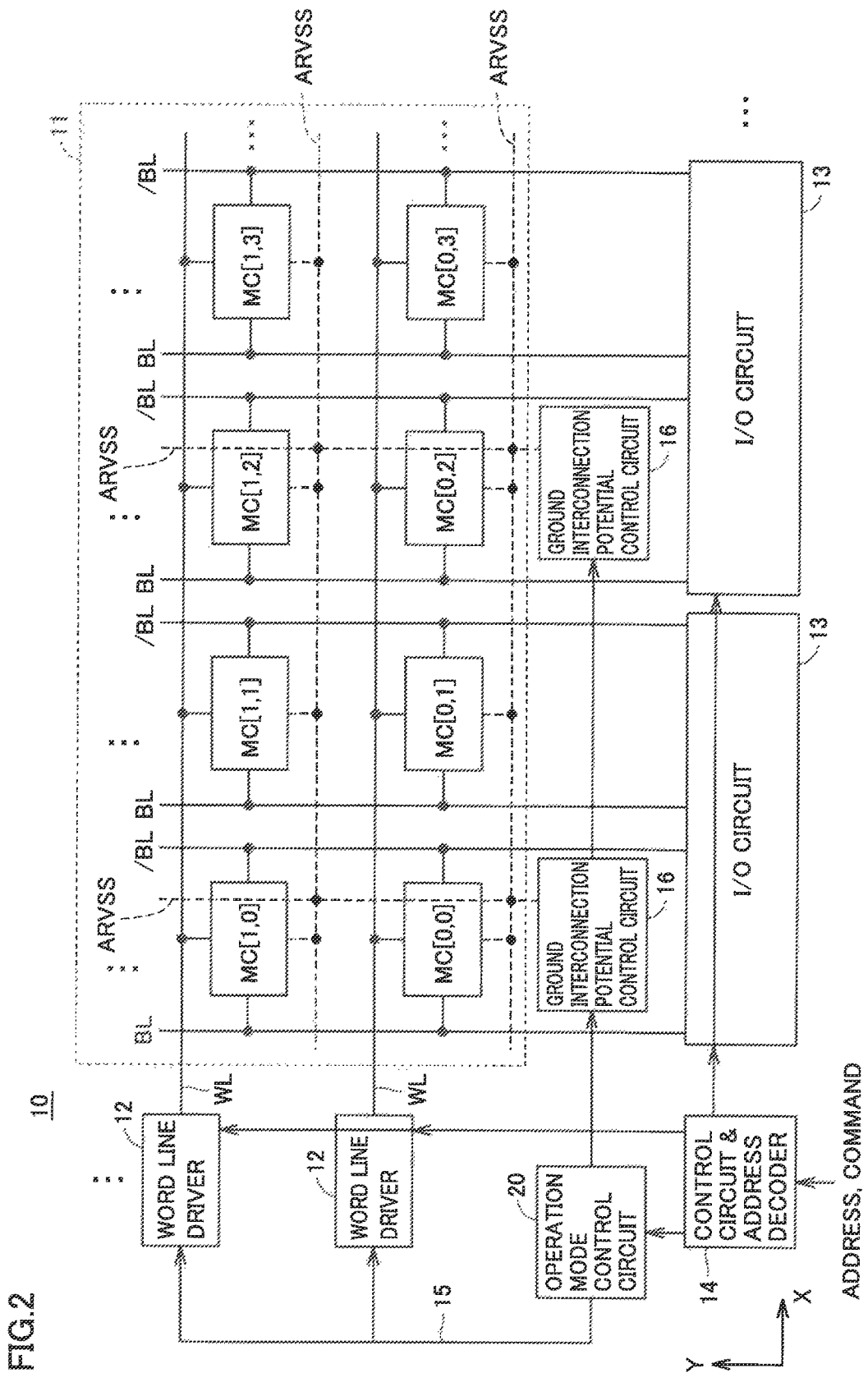
FIG. 2 is a block diagram schematically showing the configuration of a SRAM circuit of FIG. 1.

FIG. 2 is a block diagram schematically showing the configuration of the SRAM circuit of FIG. 1. With reference to FIG. 1, SRAM circuit 10 includes a memory array 11, a plurality of word lines WL, a plurality of pairs of bit lines BL and /BL, a plurality of word line drivers 12, a plurality of input/output (I/O) circuits 13, and a control circuit & address decoder 14. SRAM circuit 10 further includes a ground interconnection ARVSS, a (not-shown) power supply interconnection ARVDD, a plurality of ground interconnection potential control circuits 16, and an operation mode control circuit 20.

Memory array 11 includes a plurality of memory cells MC arranged in a matrix.

In FIG. 2, a memory cell MC of an i-th row and a j-th column ($0 \leq i \leq m$; $0 \leq j \leq n$) is indicated by MC [i,j]. Memory array 11 includes a total of $(m+1) \times (n+1)$ memory cells of m+1 rows and n+1 columns. FIG. 2 representatively shows memory cells MC [0, 0] to MC [1, 3] of two rows and four columns.

Word lines WL extending in a row direction (X direction) are provided to correspond to the respective rows of memory array 11, and pairs of bit lines BL and /BL extending in a column direction (Y direction) are provided to correspond to the respective columns of memory array 11. Each word line WL is connected to each of memory cells MC provided in a corresponding row. Each pair of bit lines BL and /BL is connected to each of memory cells MC provided in a corresponding column.

Word line drivers 12 are provided to correspond to the respective word lines WL. When a corresponding row is selected in accordance with a result of decoding an address signal provided from the outside of SRAM circuit 10, each word line driver 12 activates word line WL of the corresponding row (namely, provides a voltage of high logic level (H level)).

Each one of I/O circuits 13 is provided for a plurality of columns. FIG. 2 shows a configuration of MUX2 (multiplex 2) in which each one of I/O circuits 13 is provided for every two columns. Instead of the configuration of FIG. 2, the configuration may be that of MUX 4 in which each one of I/O circuits 13 is provided for every four columns, or that of MUX 8 in which each one of I/O circuits 13 is provided for every eight columns. I/O circuit 13 receives write data from the outside of SRAM circuit 10, and writes the data into a selected memory cell MC of corresponding columns. Further, I/O circuit 13 reads data from a selected memory cell MC of corresponding columns, and outputs the read data to the outside SRAM of circuit 10.

Control circuit & address decoder 14 controls timing of writing the data and reading the data at I/O circuit 13 in accordance with an externally provided command (a write command and a read command). Further, control circuit & address decoder 14 decodes an address signal provided from the outside of SRAM circuit 10, and drives word line driver 12 and I/O circuit 13 corresponding to a row and a column selected based on a result of the decoding.

Ground interconnection ARVSS is interconnected as a mesh within memory array 11, and connected to each memory cell MC. In the normal operation mode, a ground potential (0V) is supplied to each memory cell MC through ground interconnection ARVSS. A (not-shown) power supply interconnection ARVDD interconnected as a mesh is also provided in memory array 11, in order to supply a power supply potential to each memory cell MC.

In the example of FIG. 2, each one of ground interconnection potential control circuits 16 is disposed for each I/O circuit 13. Ground interconnection potential control circuit 16 controls the potential of ground interconnection ARVSS such that the potential attains to a prescribed potential depending on the operation mode. Specifically, ground interconnection potential control circuit 16 controls the potential of ground interconnection ARVSS such that the potential attains to the ground potential in the normal operation mode, and controls the potential of ground interconnection ARVSS such that the potential attains to an intermediate potential between the ground potential and the power supply potential in the resume standby mode. Further, ground interconnection potential control circuit 16 controls ground interconnection ARVSS to be in a floating state in the shutdown mode.

Operation mode control circuit 20 controls the operation of each ground interconnection potential control circuit 16 in accordance with a signal indicating an operation mode and provided by control circuit & address decoder 14.

[Configuration of Memory Cell and Ground Interconnection Potential Control Circuit]

Figure 3:
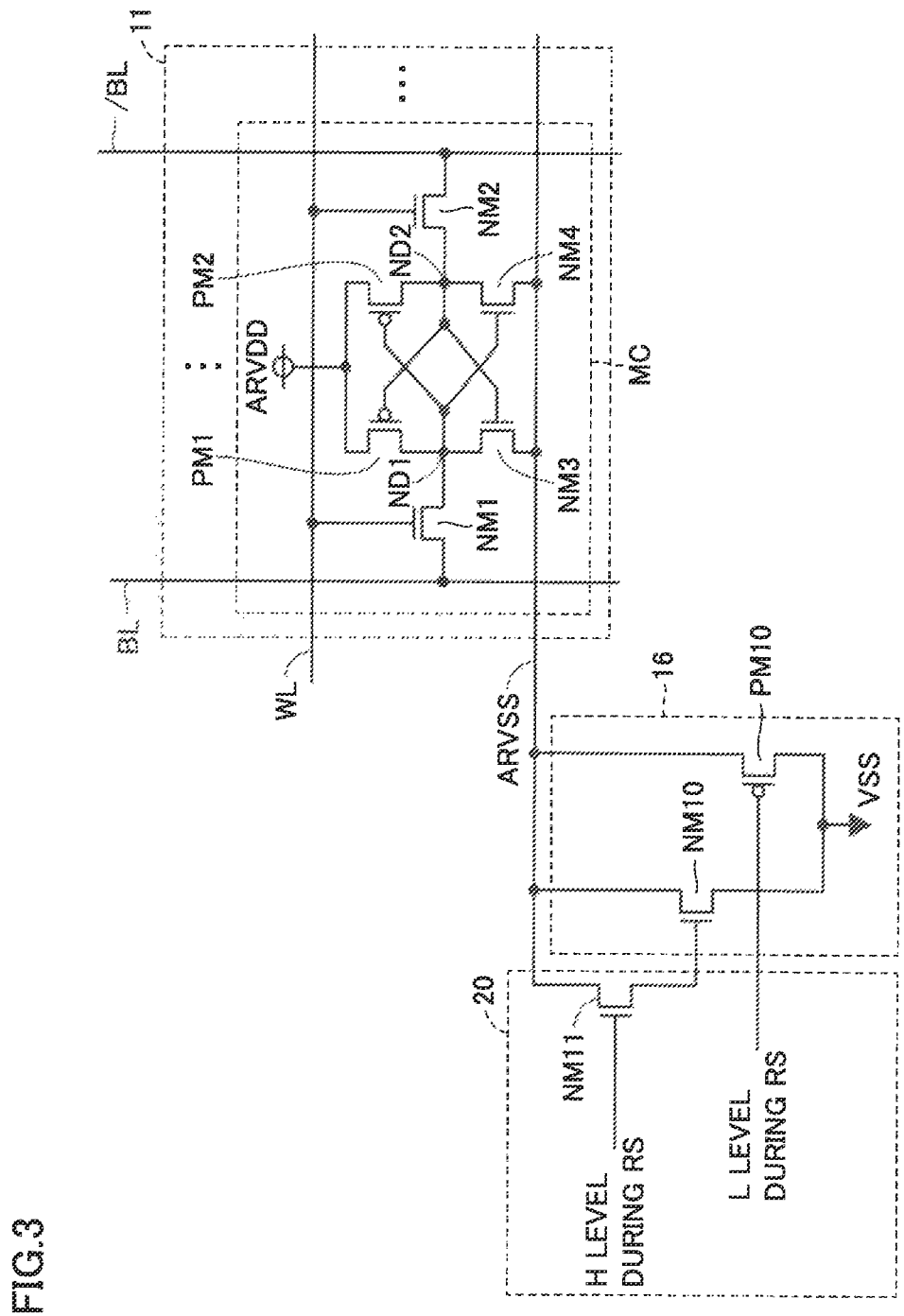
FIG. 3 is a circuit diagram showing a more detailed configuration of a memory cell MC and a ground interconnection potential control circuit 16 of FIG. 2.

FIG. 3 is a circuit diagram showing a more detailed configuration of memory cell MC and ground interconnection potential control circuit 16 of FIG. 2.

(Memory Cell MC)

With reference to FIG. 3, each memory cell MC includes: a latch circuit formed of two CMOS (Complementary MOS) inverters; and two transfer NMOS transistors NM1, NM2.

A first CMOS inverter forming the latch circuit includes a PMOS transistor PM1 and an NMOS transistor NM3 connected in series between power supply interconnection ARVDD and ground interconnection ARVSS. A second CMOS inverter forming the latch circuit includes a PMOS transistor PM2 and an NMOS transistor NM4 connected in series between power supply interconnection ARVDD and ground interconnection ARVSS. A connection node ND1 between PMOS transistor PM1 and NMOS transistor NM3 is connected to the gate of each of PMOS transistor PM2 and NMOS transistor NM4. A connection node ND1 between PMOS transistor PM2 and NMOS transistor NM4 is connected to the gate of each of PMOS transistor PM1 and NMOS transistor NM3.

Transfer NMOS transistor NM1 is connected between connection node ND1 and bit line BL. Transfer NMOS transistor NM2 is connected between connection node ND2 and bit line /BL. NMOS transistors NM1 and NM2 each have a gate connected to a common word line WL.

Each memory cell MC holds complementary potentials at connection nodes ND1 and ND2 (potentials that cause one of the nodes to be at H level and the other node to be at L level (low-level)). A procedure of write operation is now briefly described. When connection node ND1 is to hold a voltage of H level and connection node ND2 is to hold a voltage of low-level (L level), for example, first, the potential of bit line BL is set to H level and the potential of bit line /BL is set to L level. Then, the potential of word line WL that has been changed from L level to H level is held for a prescribed period of time, whereby the potential of connection node ND1 changes to H level and the potential of connection node ND2 changes to L level.

A procedure of read operation is briefly described next. Assume that the potential of connection node ND1 is preset to H level, and the potential of connection node ND2 is preset to L level. First, the pair of bit lines BL and /BL is precharged to the power supply potential. Then, word line WL is changed from L level to H level, whereby the potential of bit line BL connected to connection node ND1 holding a H level voltage does not change, whereas the potential of bit line /BL connected to connection node ND2 holding an L level voltage decreases. By amplifying this potential difference between bit lines BL and /BL by means of a (not-shown) sense amplifier provided in I/O circuit 13, the data held in memory cell MC can be read.

(Ground Interconnection Potential Control Circuit 16)

Ground interconnection potential control circuit 16 includes an NMOS transistor NM10 and a PMOS transistor PM10 connected in parallel to each other between ground interconnection ARVSS and a ground node VSS providing the ground potential. That is, NMOS transistor NM10 has a grounded source, whereas PMOS transistor PM10 has a grounded drain (source follower). Further, NMOS transistor NM10 has a gate connected to ground interconnection ARVSS through an NMOS transistor NM11 provided in operation mode control circuit 20. Operation mode control circuit 20 sets the gate of each of NMOS transistors NM10, NM11 as well as the gate of PMOS transistor PM10 to a potential depending on the operation mode.

Specifically, in the resume standby (RS) mode, the gate potential of NMOS transistor NM11 is set to H level (power supply potential), and thus NMOS transistor NM10 is connected as a diode. Further, the gate potential of PMOS transistor PM10 is set to L level (ground potential), and thus PMOS transistor PM10 is in an ON state.

According to the above configuration, as a result of NMOS transistor NM10 being connected as a diode, the potential of ground interconnection ARVSS rises to a certain potential from the ground potential. As a leakage current of the PMOS transistor forming memory cell MC increases, the rise of the potential of ground interconnection ARVSS increases. On the other hand, the current is drawn from ground interconnection ARVSS through PMOS transistor PM10, causing the potential of ground interconnection ARVSS to decrease. A balance of these potentials determines the final potential of ground interconnection ARVSS.

When the NMOS transistor has characteristics in a slow corner and the PMOS transistor has characteristics in a fast corner due to global variation, NMOS transistor NM10 alone cannot suppress an excessive rise of the potential of ground interconnection ARVSS caused by the leakage current of the PMOS transistor forming the memory cell. In the configuration of FIG. 3, electric charges are drawn from ground interconnection ARVSS through PMOS transistor PM10, thereby preventing an excessive rise of the potential of ground interconnection ARVSS in the standby mode.

In the normal operation mode (NOP mode), on the other hand, operation mode control circuit 20 sets the gate potential of NMOS transistor NM11 to L level to thereby control NMOS transistor NM11 to be in an OFF state, and sets the gate potential of NMOS transistor NM10 to H level to thereby control NMOS transistor NM10 to be in an ON state. Further, operation mode control circuit 20 sets the gate potential of PMOS transistor PM10 to L level to thereby control PMOS transistor PM10 to be in an ON state as well. Accordingly, the potential of ground interconnection ARVSS is maintained at the ground potential.

In the shutdown mode (SD mode), operation mode control circuit 20 sets the gate potential of NMOS transistors NM10 and NM11 to L level to thereby control NMOS transistors NM10 and NM1 to be in an OFF state. Further, operation mode control circuit 20 sets the gate potential of PMOS transistor PM10 to H level to thereby control PMOS transistor PM10 to be in an OFF state. Accordingly, ground interconnection ARVSS enters a floating state.

[Configuration Example of Operation Mode Control Circuit 20]

Figure 4:
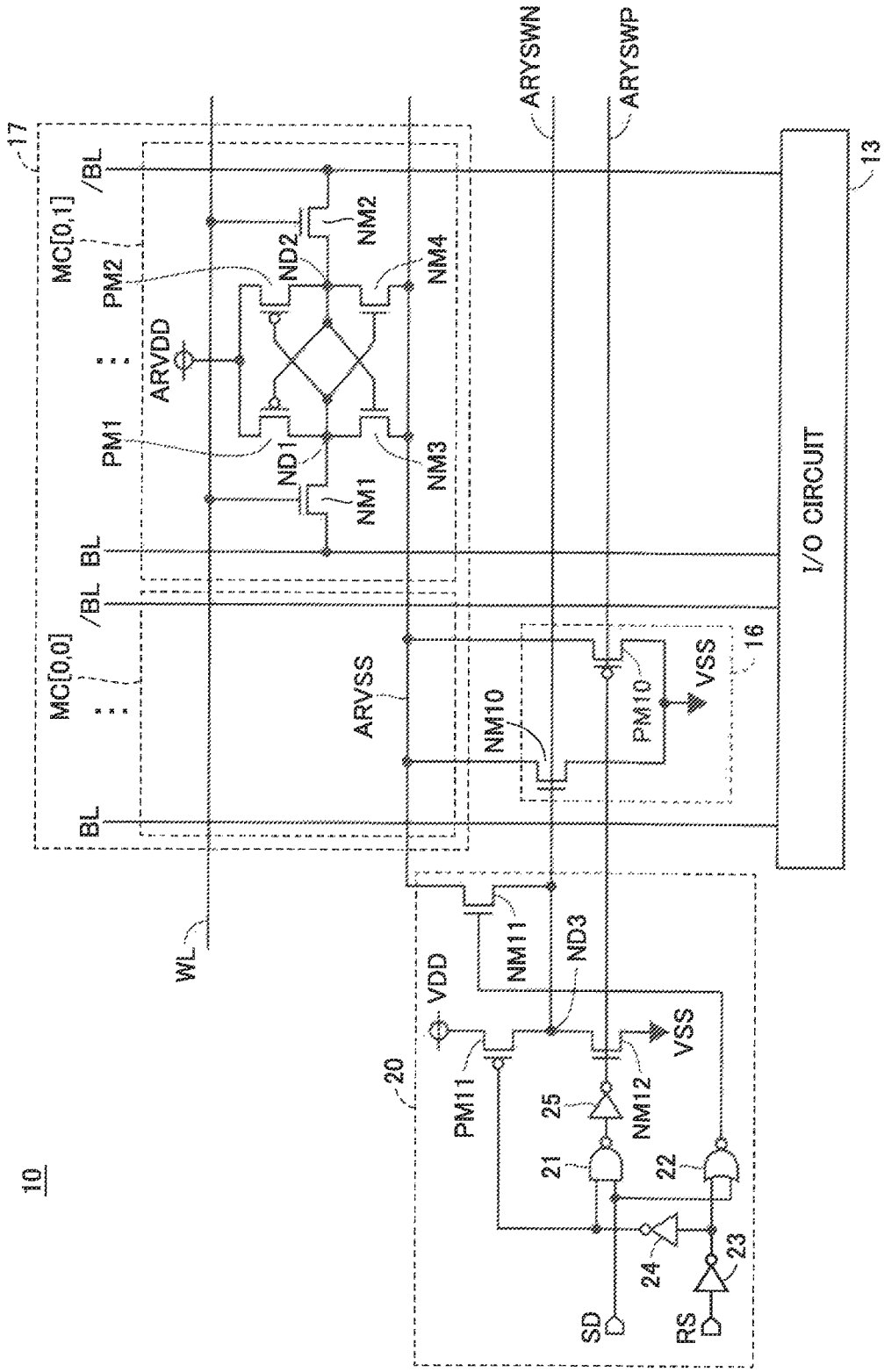
FIG. 4 is a circuit diagram showing an example configuration of an operation mode control circuit 20 of FIG. 2.

FIG. 4 is a circuit diagram showing an example configuration of operation mode control circuit 20 of FIG. 2. FIG. 4 only shows a portion of SRAM circuit 10 of FIG. 2 that corresponds to one I/O circuit 13. In the following, two columns in memory array 11 that correspond to one I/O circuit 13 may be referred to as a memory cell group 17. Each one of ground interconnection potential control circuits 16 is disposed for each I/O circuit 13.

With reference to FIG. 4, NMOS transistor NM10 forming ground interconnection potential control circuit 16 has a gate connected to a control line ARYSWN common to each ground interconnection potential control circuit 16. NMOS transistor NM10 has a source connected to ground node VSS, and a drain connected to ground interconnection ARVSS. NMOS transistor NM10 has a back gate connected to ground node VSS.

PMOS transistor PM10 forming each ground interconnection potential control circuit 16 has a gate connected to a control line ARYSWP common to each ground interconnection potential control circuit 16. PMOS transistor PM10 has a source connected to ground interconnection ARVSS, and a drain connected to ground node VSS. PMOS transistor PM10 has a back gate connected to power supply node VDD providing the power supply potential.

Operation mode control circuit 20 outputs control signals to control lines ARYSWN and ARYSWP based on control signals RS and SD received from control circuit & address decoder 14 of FIG. 2. Specifically, operation mode control circuit 20 includes a PMOS transistor PM11 as a switch, NMOS transistors NM11, NM12 as switches, inverters 23, 24, 25, a NAND gate 21, and a NOR gate 22.

PMOS transistor PM11 and NMOS transistor NM12 are connected in series in this order of arrangement between power supply node VDD and ground node VSS. NMOS transistor NM11 is connected between ground interconnection ARVSS, and a connection node ND3 between PMOS transistor PM11 and NMOS transistor NM12.

Control signal SD is input to a first input terminal of NAND gate 21 and a first input terminal of NOR gate 22. Control signal RS is input to a second input terminal of NAND gate 21 through inverters 23 and 24 (thus, a signal of the same logical level as control signal RS is input). Control signal RS is input to a second input terminal of NOR gate 22 through inverter 23.

Control signal RS is input the gate of PMOS transistor PM11 through inverters 23 and 24 (thus, a signal of the same logical level as control signal RS is input). An output signal of NAND gate 21 is input to the gate of NMOS transistor NM12 and control line ARYSWP after being inverted by inverter 25. Control line ARYSWN is connected to connection node ND3 between PMOS transistor PM11 and NMOS transistor NM12. An output signal of NOR gate 22 is input to the gate of NMOS transistor NM11.

[Operation of Operation Mode Control Circuit 20]

Figure 5:
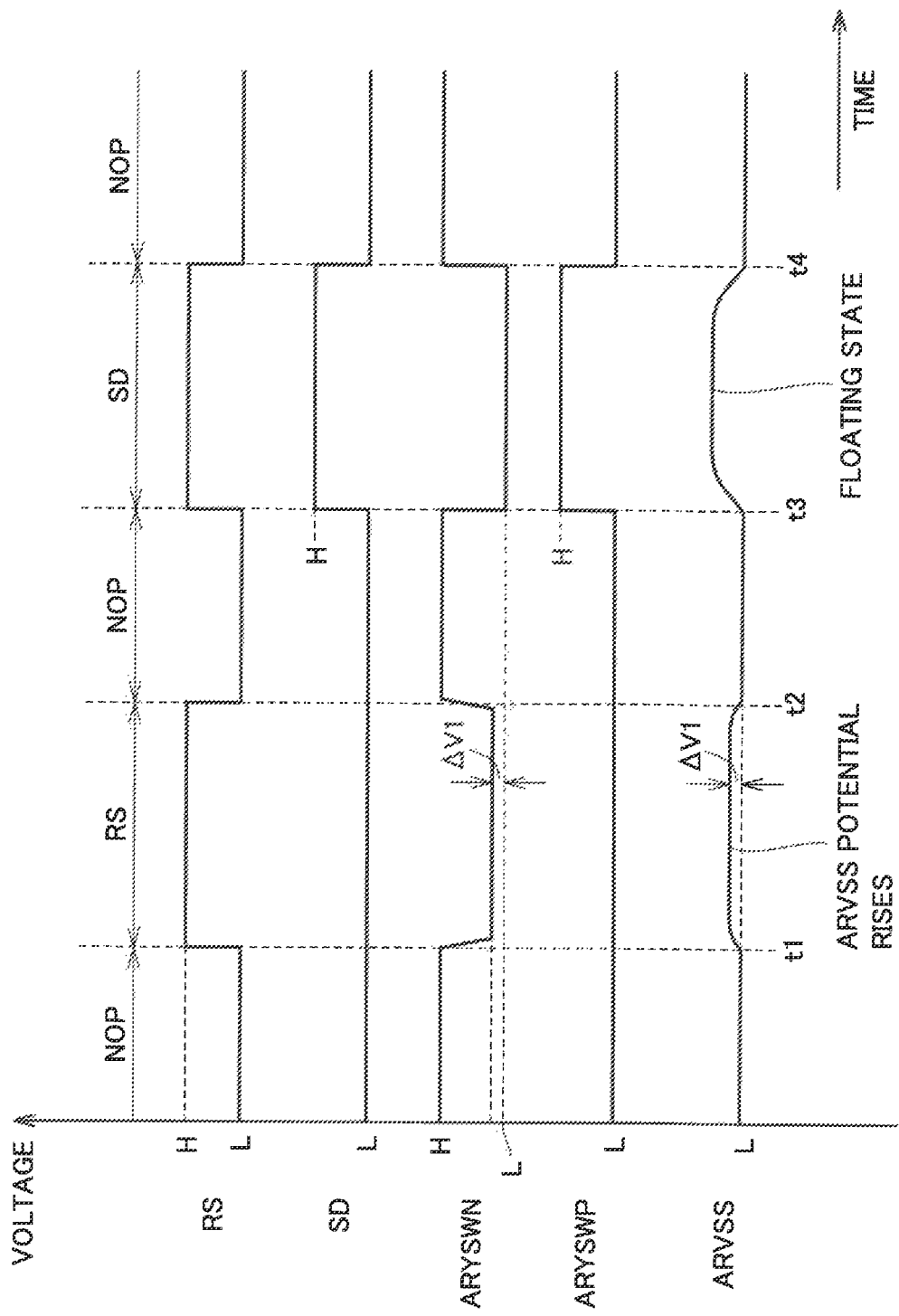
FIG. 5 is a timing chart showing the operation of operation mode control circuit 20.

FIG. 5 is a timing chart showing the operation of operation mode control circuit 20. With reference to FIGS. 4 and 5, the operation of the operation mode control circuit will be described below.

The normal operation (NOP) mode corresponds to time before time t1, time between time t2 and time t3, and time after time t4 in FIG. 5. In the normal operation (NOP) mode, both control signals RS and SD are at L level. In this case, the gate potential of NMOS transistor NM11 is set to L level, and thus NMOS transistor NM11 is in an OFF state. The gate potential of PMOS transistor PM11 is set to L level, and thus PMOS transistor PM11 is in an ON state. The gate potential of NMOS transistor NM12 is set to L level, and thus NMOS transistor NM12 is in an OFF state. As a result, the potential of control line ARYSWN is set to H level, and thus NMOS transistor NM10 provided in each ground interconnection potential control circuit 16 is in an ON state. Further, the potential of control line ARYSWP is set to L level, and thus PMOS transistor PM10 provided in each ground interconnection potential control circuit 16 is in an ON state. As such, in the normal operation (NOP) mode, the potential of ground interconnection ARVSS becomes substantially equal to the ground potential.

The resume standby (RS) mode corresponds to time between time t and time t2 in FIG. 5. In the resume standby (RS) mode, control signal RS is at H level and control signal SD is at L level. In this case, the gate potential of NMOS transistor NM11 is set to H level, and thus NMOS transistor NM11 is in an ON state. Further, the gate potential of PMOS transistor PM11 is set to H level and the gate potential of NMOS transistor NM12 is set to L level, and thus these transistors PM11 and NM12 are in an OFF state. In this manner, in the resume standby (RS) mode, connection node ND3 and control line ARYSWN are connected to ground interconnection ARVSS, without being connected to any of power supply node VDD and ground node VSS. As a result, NMOS transistor NM10 is connected as a diode. Further, in the resume standby (RS) mode, the potential of control line ARYSWP is set to L level, and thus PMOS transistor PM10 is in an ON state.

According to the above configuration, as a result of NMOS transistor NM10 being connected as a diode, the potential of ground interconnection ARVSS rises to a certain potential from the ground potential. On the other hand, electric charges of ground interconnection ARVSS are drawn through PMOS transistor PM11, causing the potential of ground interconnection ARVSS to decrease and be stabilized at a final potential ΔV1 of ground interconnection ARVSS.

The shutdown (SD) mode corresponds to time between time t3 and time t4 in FIG. 5. In the shutdown (SD) mode, both control signals RS and SD are at H level. In this case, the gate potential of NMOS transistor NM11 is set to L level, and thus NMOS transistor NM11 is in an OFF state. The gate potential of PMOS transistor PM11 is set to H level, and thus PMOS transistor PM11 is in an OFF state. The gate potential of NMOS transistor NM12 is set to H level, and thus NMOS transistor NM12 is in an ON state. As a result, the potential of control line ARYSWN is set to L level, and thus NMOS transistor NM10 provided in each ground interconnection potential control circuit 16 is in an OFF state. Further, the potential of control line ARYSWP is set to H level, and thus PMOS transistor PM10 is in an OFF state. As such, in the resume standby (RS) mode, ground interconnection ARVSS enters a floating state.

[Variation of Ground Interconnection Potential Control Circuit and Operation Mode Control Circuit]

When the operation modes of the SRAM circuit include only the normal operation mode and the resume standby mode and does not include the shutdown mode, the configuration of ground interconnection potential control circuit 16 and operation mode control circuit 20 of FIG. 4 can be simplified, which will be specifically described below with reference to a drawing.

Figure 6:
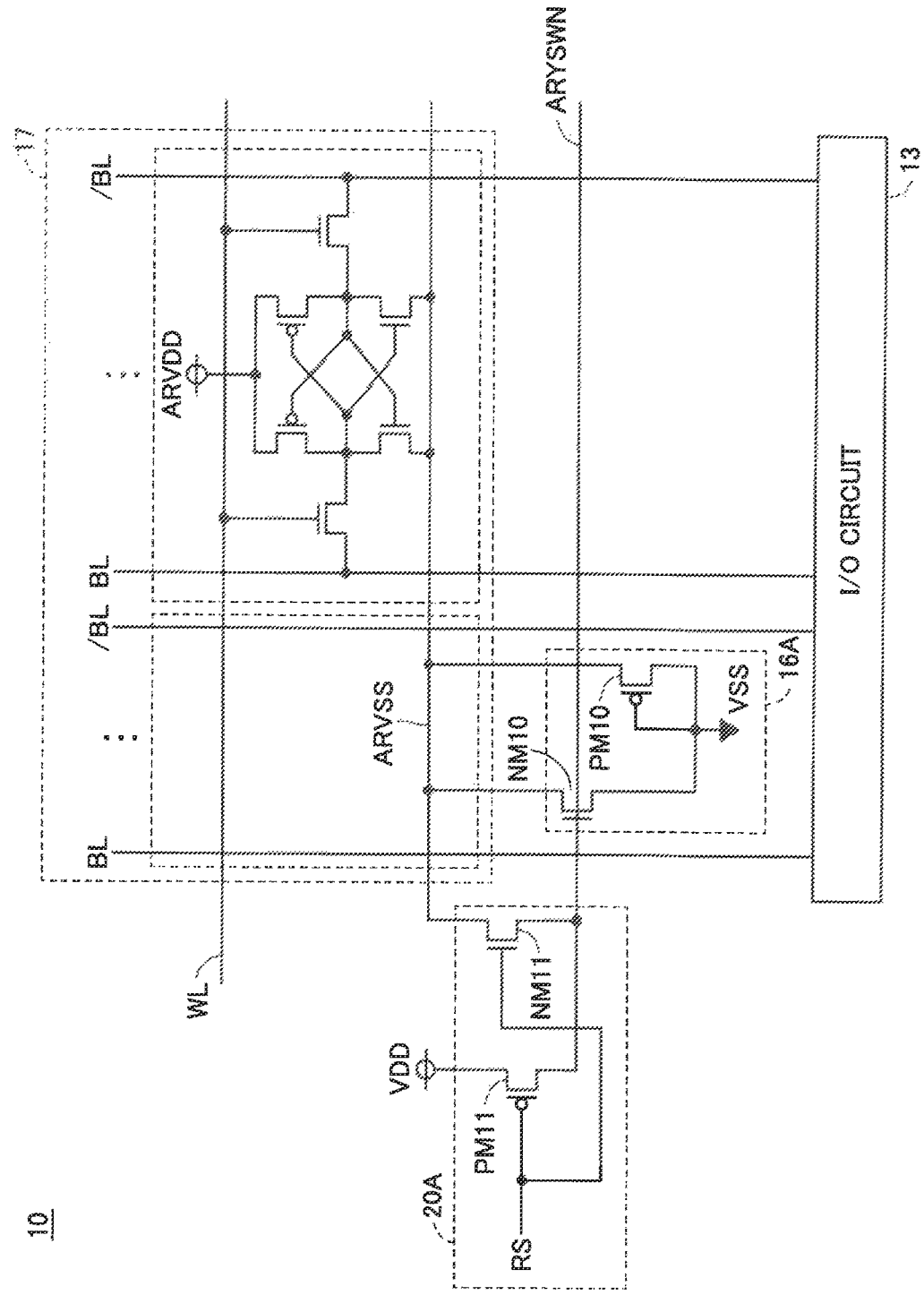
FIG. 6 is a circuit diagram of a variation of FIG. 4.

FIG. 6 is a circuit diagram of a variation of FIG. 4. A ground interconnection potential control circuit 16A of FIG. 6 is different from ground interconnection potential control circuit 16 of FIG. 4 in that the gate of PMOS transistor PM10 is connected to ground node VSS at all times (thus, in an ON state at all times). Specifically, PMOS transistor PM10 has a source connected to ground interconnection ARVSS, and a drain and a gate connected to ground node VSS. PMOS transistor PM10 has a back gate connected to power supply node VDD. Control line ARYSWP is not provided in the case of FIG. 6. The connection of NMOS transistor NM10 is the same as that of FIG. 4, and thus will not be described repeatedly.

An operation mode control circuit 20A of FIG. 6 controls the potential of control line ARYSWN commonly connected to the gate of NMOS transistor NM10 of each ground interconnection potential control circuit 16A, based on control signal RS received from control circuit & address decoder 14 of FIG. 2. Specifically, operation mode control circuit 20A includes NMOS transistor NM11 as a switch, and PMOS transistor PM11 as a switch.

NMOS transistor NM11 is connected between ground interconnection ARVSS and control line ARYSWN. PMOS transistor PM11 is connected between power supply node VDD and control line ARYSWN. Control signal RS is input to the gate of each of NMOS transistor NM11 and PMOS transistor PM11.

In the normal operation (NOP) mode, control signal RS is at L level. In this case, NMOS transistor NM11 is in an OFF state and PMOS transistor PM11 is in an ON state, and thus the potential of control line ARYSWN is set to H level (power supply potential). Accordingly, NMOS transistor NM10 is in an ON state, thus lowering the potential of ground interconnection ARVSS to the ground potential together with PMOS transistor PM10 in an ON state.

In the resume standby (RS) mode, control signal RS is at H level. In this case, NMOS transistor NM11 is in an ON state and PMOS transistor PM11 is in an OFF state, and thus NMOS transistor NM10 is connected as a diode. Accordingly, the potential of ground interconnection ARVSS becomes higher than the ground potential. However, since electric charges of ground interconnection ARVSS are drawn by PMOS transistor PM11 being in an ON state and having a grounded drain, an excessive rise of the potential of ground interconnection ARVSS can be suppressed.

[Effect of First Embodiment]

As described above, according to the first embodiment, NMOS transistor NM10 and PMOS transistor PM10 are provided in parallel to each other between ground interconnection ARVSS connected to each memory cell MC of the SRAM circuit and ground node VSS providing the ground potential. In the resume standby mode, the gate of NMOS transistor NM10 is connected to ground interconnection ARVSS, causing NMOS transistor NM10 to be connected as a diode. An L level signal is provided to the gate of PMOS transistor PM10, causing PMOS transistor PM10 to be in an ON state.

According to the above configuration, in the resume standby mode, the potential of ground interconnection ARVSS can be raised, within a range in which the data held in memory cell MC is not destructed, to a potential that allows a reduction in leakage current of the memory cell. In particular, even when the NMOS transistor has characteristics in a slow corner and the PMOS transistor has characteristics in a fast corner due to global variation, an excessive rise of the potential of ground interconnection ARVSS can be prevented because the current can be drawn from ground interconnection ARVSS through PMOS transistor PM10 having characteristics in the fast corner.

Particularly in the state-of-the-art processes using fin-FETs, with higher performance of the PMOS transistor and greater global variation than conventional processes, an excessive rise of the potential of ground interconnection ARVSS tends to occur during the resume standby. The above configuration is particularly useful when forming MOS transistors using finFETs.

<Second Embodiment>

A second embodiment describes the arrangement of ground interconnection potential control circuit 16, described with reference to FIGS. 2, 4 and the like, on the semiconductor substrate. In the following, a desired arrangement of a P well and an N well within a cell will be described first.

[As to Arrangement of N Well and P Well Within Cell]

In general, a power supply potential is supplied to an N well and a ground potential is supplied to a P well. In the case of a cell-based IC (Integrated Circuit), a problem does not arise when N wells of a plurality of cells using the same power supply voltage are brought into contact with each other. However, N wells of a plurality of cells using different power supply voltages (for example, a standard cell and an IO cell) cannot be brought into contact with each other. In this case, the space between the N wells needs to be widened. For this reason, there are limitations to the arrangement of an N well within a cell.

Figure 7:
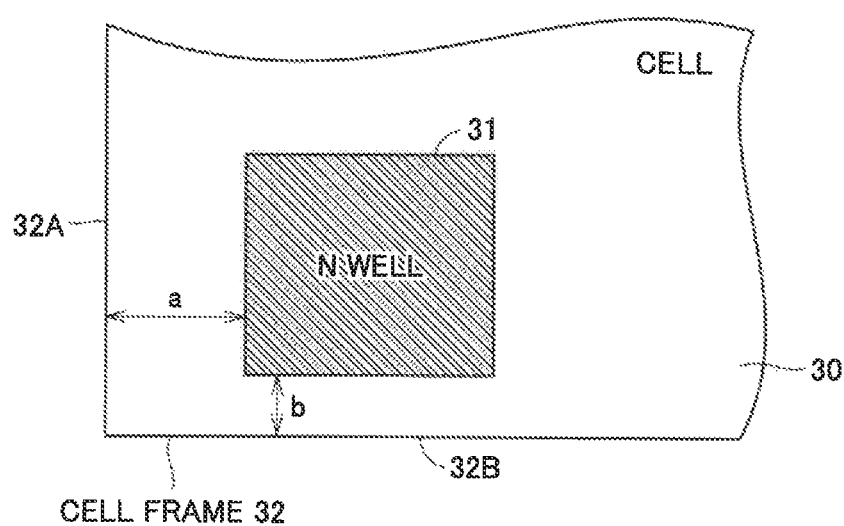
FIG. 7 is a plan view illustrating the arrangement of an N well within a cell.

FIG. 7 is a plan view illustrating the arrangement of an N well within a cell. With reference to FIG. 7, it is desired to arrange an N well 31 at distances a and b from frames 32A and 32B of a cell 30, respectively, so as to satisfy design rules with any type of cells arranged next to cell 30. Thus, it is desired to arrange a P well in a region in the vicinity of cell frame 32. This is because, if an N well is arranged in a region in the vicinity of cell frame 32, the space between this cell and an adjacent cell needs to be widened. In the case of the SRAM circuit discussed below, too, it is desired for an end portion of a region in which the SRAM circuit is arranged to be a P well wherever possible.

[Example Arrangement of Ground Interconnection Potential Control Circuit]

Figure 8:
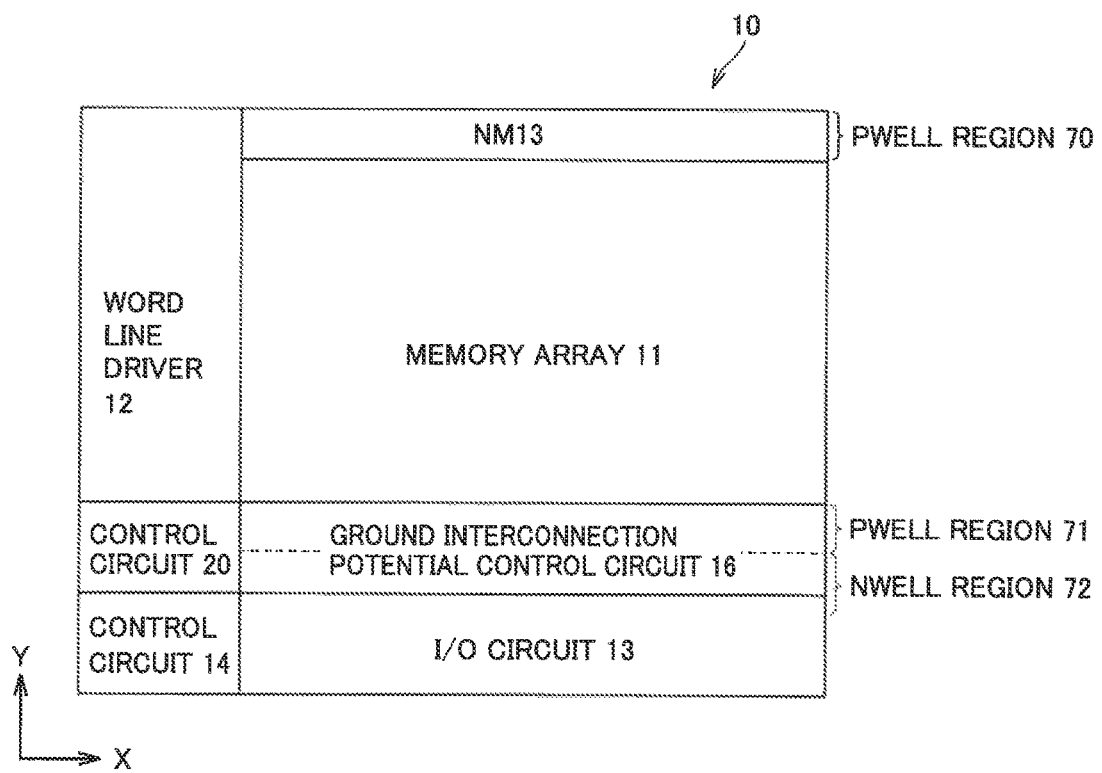
FIG. 8 is a plan view showing a general layout of the SRAM circuit of FIG. 2.
Figure 9:
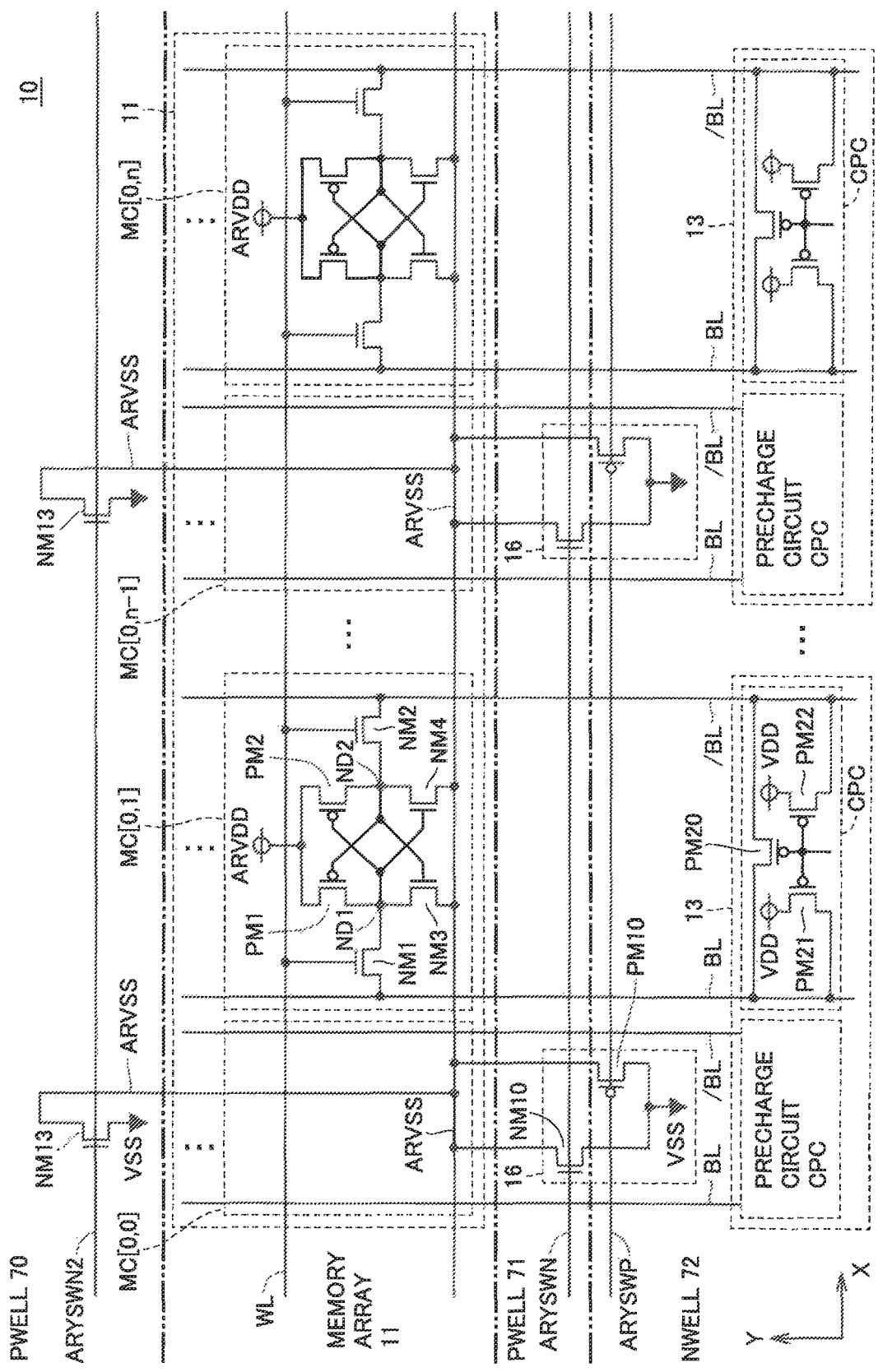
FIG. 9 is a plan view showing a more detailed arrangement of the ground interconnection potential control circuit in the SRAM circuit of FIG. 2.

FIG. 8 is a plan view showing a general layout of the SRAM circuit of FIG. 2. FIG. 9 is a plan view showing a more detailed arrangement of the ground interconnection potential control circuit in the SRAM circuit of FIG. 2. In the following, the row direction of memory array 11 is referred to as an X direction, and the column direction is referred to as a Y direction. Additionally, when distinguishing between orientations along the X direction, the orientations will be indicated with signs, such as +X direction and −X direction. The same applies to the Y direction.

With reference to FIGS. 8 and 9, in plan view of the substrate on which SRAM circuit 10 has been formed, I/O circuit 13 is disposed in the column direction (in the −Y direction) relative to a corresponding portion of memory array 11 (that is, a portion connected through the pair of bit lines BL and /BL). Ground interconnection potential control circuit 16 is disposed between memory array 11 and I/O circuit 13.

NMOS transistors NM13 are provided opposite to ground interconnection potential control circuits 16 with memory array 11 interposed therebetween. Each one of NMOS transistors NM13 is provided, for example, for each ground interconnection potential control circuit 16 (thus, for each I/O circuit 13). NMOS transistor NM13 has a drain connected to ground interconnection ARVSS, and a source connected to ground node VSS. NMOS transistor NM13 has a gate connected to a control line ARYSWN2 common to each NMOS transistor NM13.

NMOS transistor NM13 is provided to ensure that ground interconnection ARVSS is substantially equal to a ground potential VSS in the normal operation mode. Specifically, a control signal from operation mode control circuit 20 of FIG. 2 is supplied to control line ARYSWN2. In the normal operation (NOP) mode, the potential of control line ARYSWN2 is set to H level, and thus each NMOS transistor NM13 is in an ON state. This ensures that the potential of ground interconnection ARVSS for memory array 11 decreases to the ground potential. In the resume standby (RS) mode and the shutdown (SD) mode, the potential of control line ARYSWN2 is set to low level, and thus each NMOS transistor NM13 is in an OFF state.

A region in which NMOS transistor NM13 is disposed is a P well (PWELL) region 70. Thus, a termination portion of the SRAM circuit macro in the +Y direction can be a P well, thereby allowing for an area-efficient arrangement.

NMOS transistor NM10 forming ground interconnection potential control circuit 16, on the other hand, is formed in a P well region 71 extending in the X direction adjacently to the region in which memory array 11 is disposed. PMOS transistor PM10 forming ground interconnection potential control circuit 16 is disposed in an N well (NWELL) region 72, which is adjacent to this P well region 71, opposite to memory array 11 (in the −Y direction).

By disposing ground interconnection potential control circuit 16 as described above, N well region 72 in which PMOS transistor PM10 is disposed can be shared with a precharge circuit CPC provided in I/O circuit 13, thereby saving space. As shown in FIG. 9, precharge circuit CPC includes PMOS transistors PM20, PM21 and PM22. PMOS transistor PM20 is connected between first and second bit lines BL and /BL forming a pair of bit lines. PMOS transistor PM21 is connected between power supply node VDD and first bit line BL. PMOS transistor PM22 is connected between power supply node VDD and second bit line /BL. A common control signal is input to the gates of these PMOS transistors PM20, PM21 and PM22.

[Another Arrangement Example of Ground Interconnection Potential Control Circuit]

Figure 10:
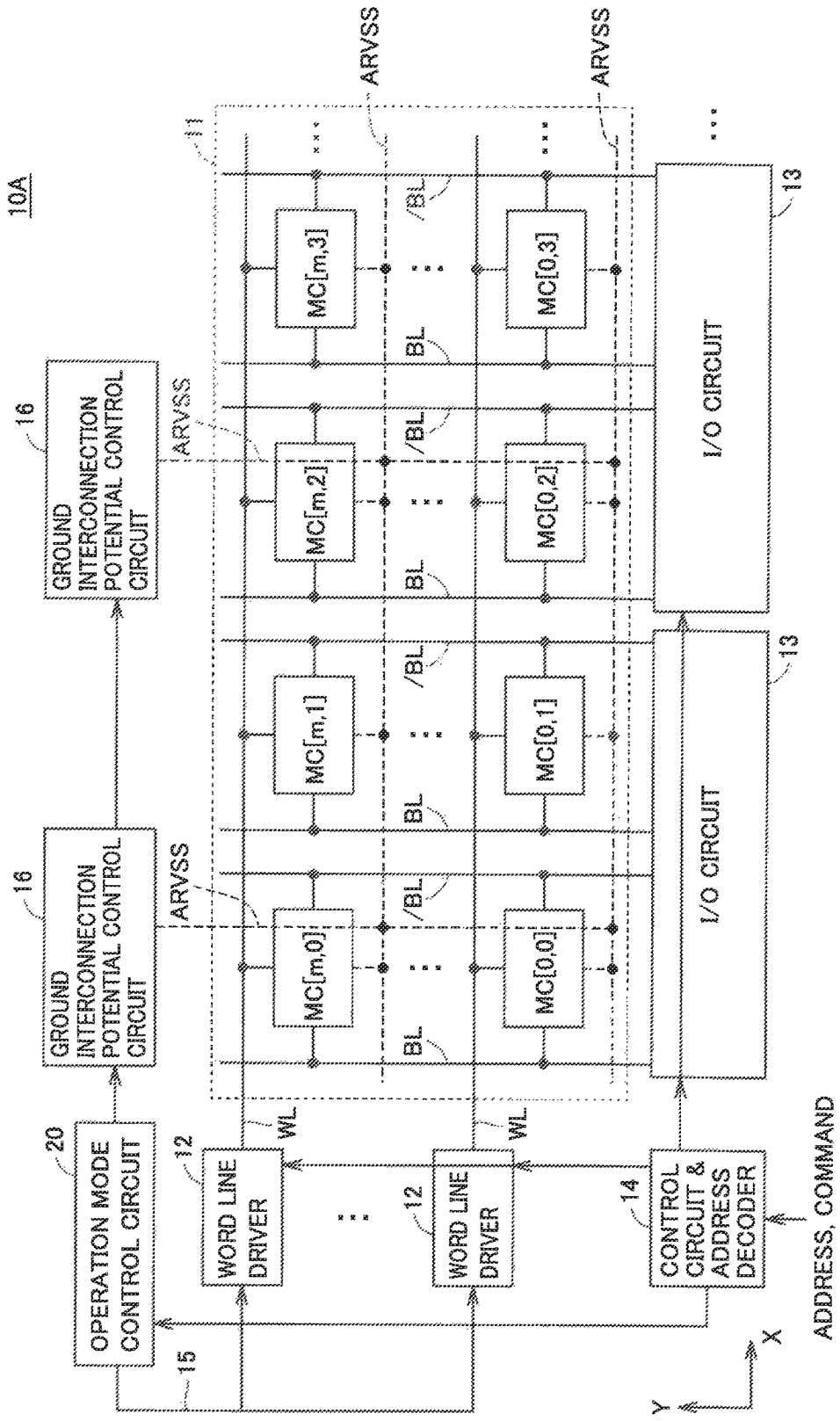
FIG. 10 is a diagram illustrating another arrangement example of the ground interconnection potential control circuit.

FIG. 10 is a diagram illustrating another arrangement example of the ground interconnection potential control circuit. The arrangement of a SRAM circuit 10A shown in FIG. 10 is a variation of the arrangement of SRAM circuit 10 in FIG. 2.

Specifically, when there is no space where operation mode control circuit 20 is disposed between the region in which word line drivers 12 are disposed and the region in which control circuit & address decoder 14 is disposed, operation mode control circuit 20 can be disposed at a termination portion in the +Y direction of the region in which word line drivers 12 are disposed, where there is relatively enough space, as shown in FIG. 10. In this case, ground interconnection potential control circuits 16 are also disposed in the +Y direction relative to memory array 11, that is, opposite to I/O circuits 13 with memory array 11 interposed therebetween.

Figure 11:
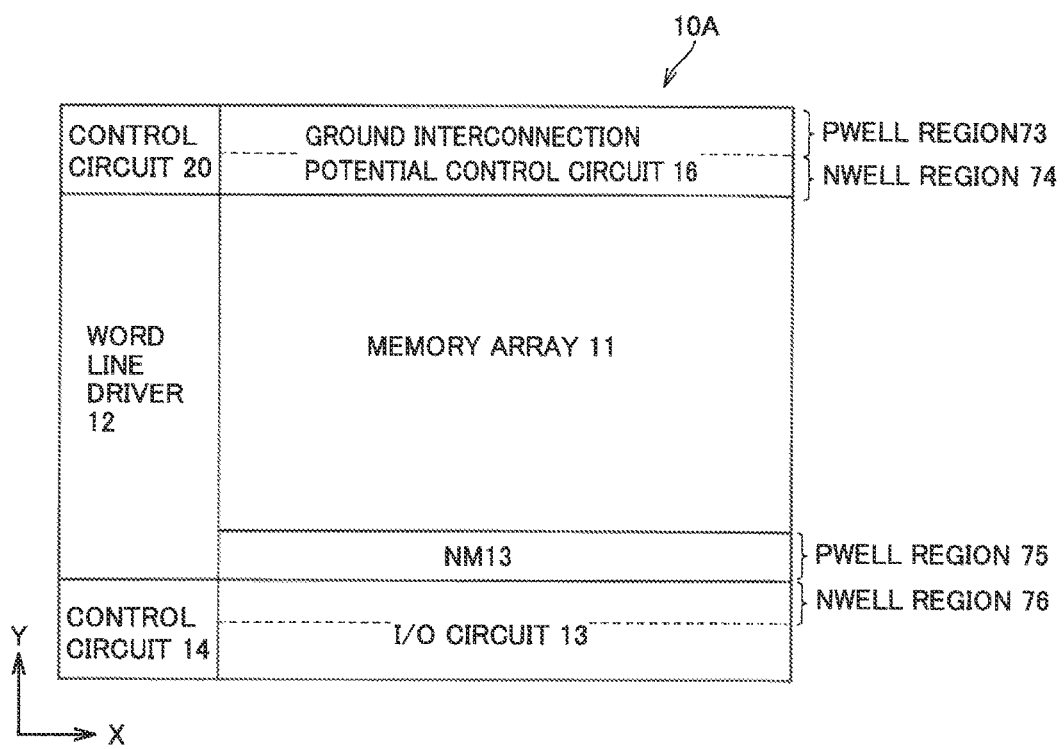
FIG. 11 is a plan view showing a general layout of a SRAM circuit of FIG. 10.
Figure 12:
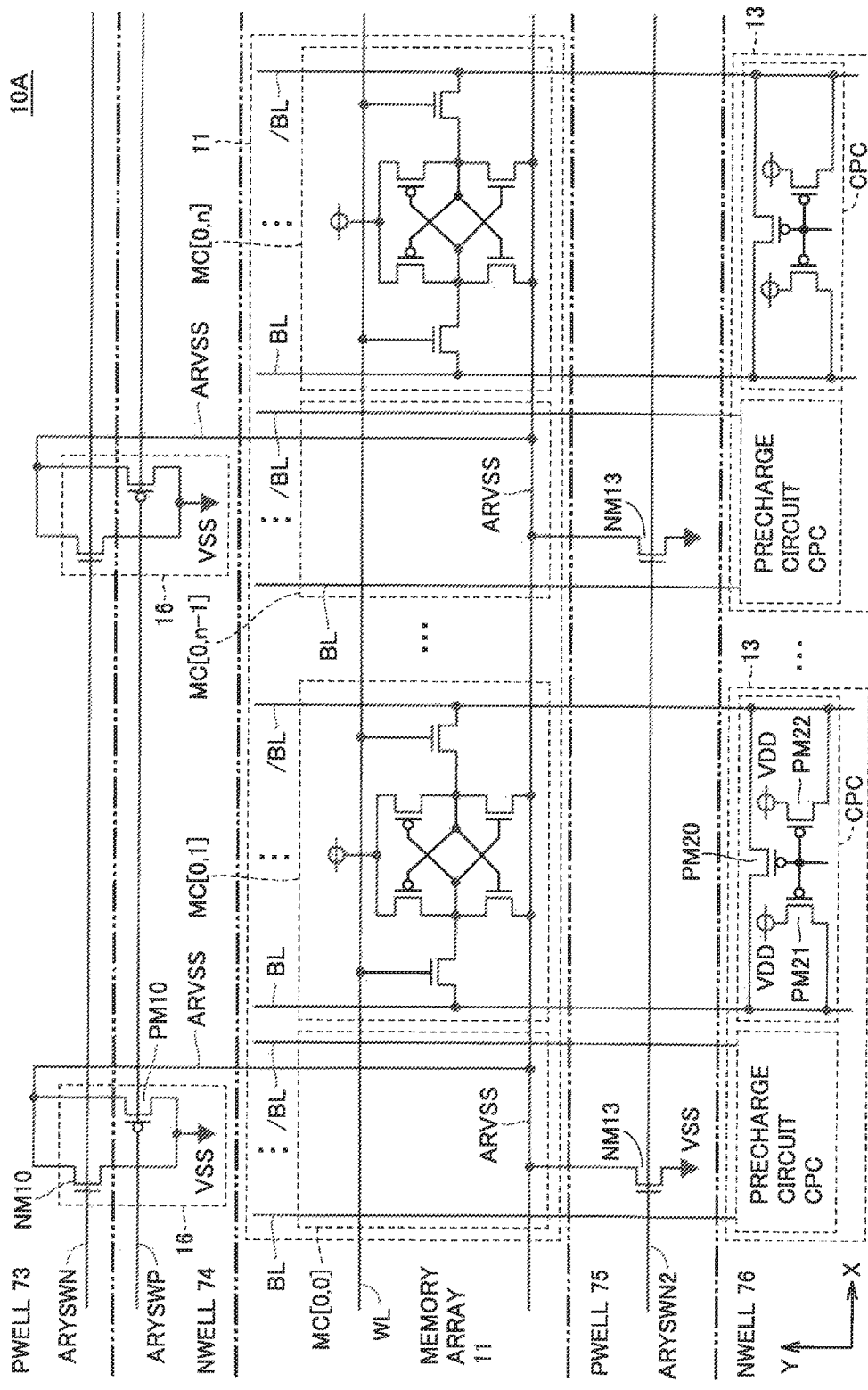
FIG. 12 is a plan view showing a more detailed arrangement of the ground interconnection potential control circuit of FIG. 10.

FIG. 11 is a plan view showing a general layout of the SRAM circuit of FIG. 10. FIG. 12 is a plan view showing a more detailed arrangement of the ground interconnection potential control circuit of FIG. 10. With reference to FIGS. 11 and 12, ground interconnection potential control circuit 16 is disposed opposite to I/O circuit 13 with memory array 11 interposed therebetween. PMOS transistor PM10 forming ground interconnection potential control circuit 16 is formed in an N well region 74 extending in the X direction adjacently to the region in which memory array 11 is disposed. NMOS transistor NM10 forming ground interconnection potential control circuit 16 is disposed in a P well region 73, which is adjacent to this N well region 74, 16 opposite to memory array 11 (in the +Y direction). Thus, a termination portion of the SRAM circuit macro in the +Y direction can be a P well, thereby allowing for an area-efficient arrangement.

Further, as was described with reference to FIG. 9, in SRAM circuit 10A, NMOS transistor NM13 is provided opposite to ground interconnection potential control circuit 16 with memory array 11 interposed therebetween, that is, between memory array 11 and the I/O circuit. NMOS transistor NM13 has a drain connected to ground interconnection ARVSS, and a source connected to ground node VSS. NMOS transistor NM13 has a gate connected to common control line ARYSWN2. NMOS transistor NM13 is controlled such that it is in an ON state in the normal operation (NOP) mode, to thereby ensure that the potential of ground interconnection ARVSS decreases to the ground potential.

As shown in FIG. 12, NMOS transistor NM13 is provided in a P well region 75 extending in the X direction adjacently to the region in which memory array 11 is disposed. Precharge circuit CPC provided in I/O circuit 13 is disposed in an N well region 76, which is adjacent to this P well region 75, opposite to memory array 11 (in the −Y direction).

[Effect of Second Embodiment]

According to the second embodiment, an area-efficient circuit arrangement can be implemented in addition to the same effect as that of the first embodiment, thereby saving space.

<Third Embodiment>

[Configuration of SRAM Circuit]

Figure 13:
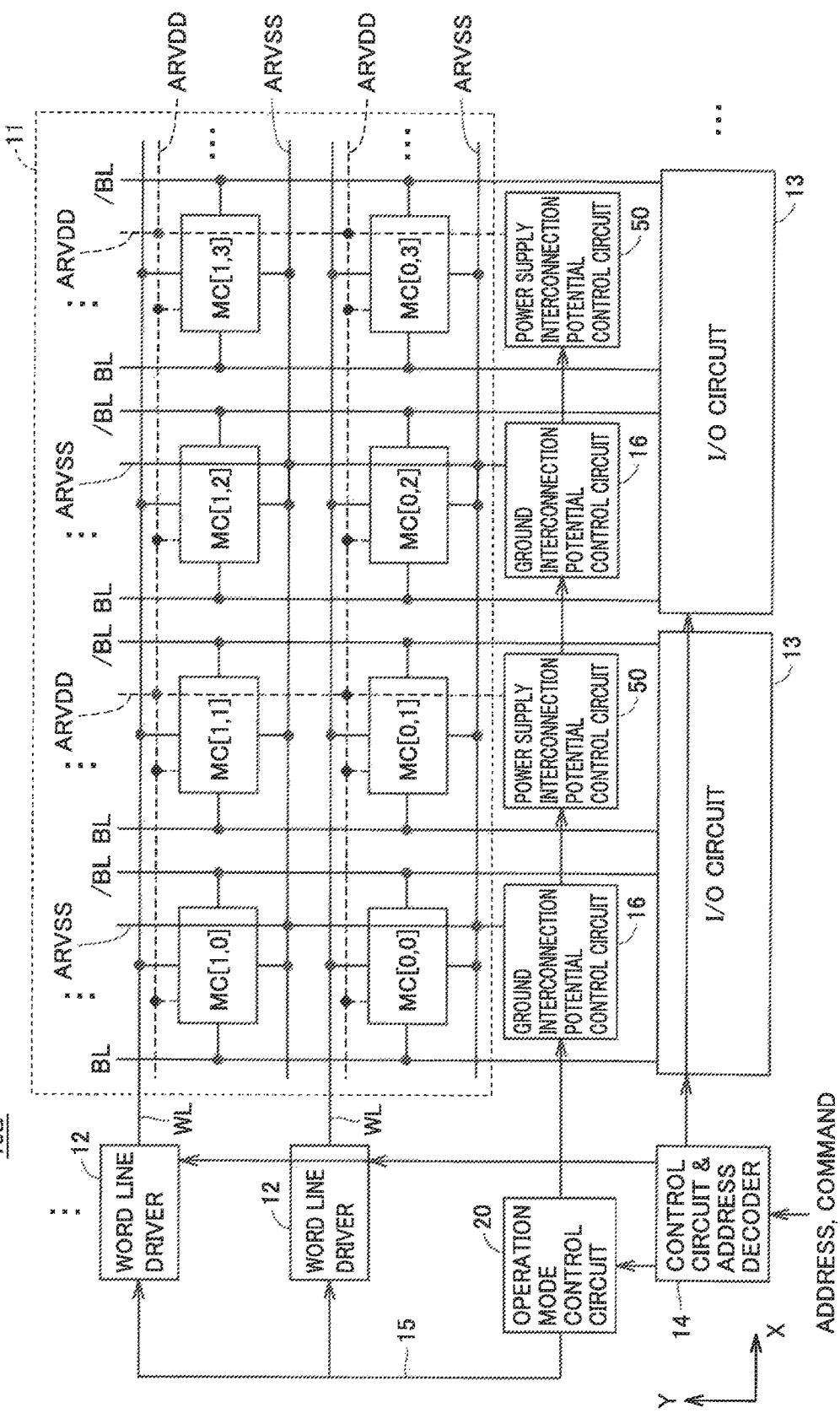
FIG. 13 is a block diagram schematically showing the configuration of a SRAM circuit in a semiconductor device of a third embodiment.

FIG. 13 is a block diagram schematically showing the configuration of a SRAM circuit in a semiconductor device of a third embodiment. A SRAM circuit 10B of FIG. 13 is different from SRAM circuit 10 of FIG. 2 in that it further includes power supply interconnection potential control circuits 50 for controlling the potential of power supply interconnection ARVDD for the memory array. Each one of power supply interconnection potential control circuits 50 is disposed for each I/O circuit 13.

Specifically, as shown in FIG. 13, power supply interconnection ARVDD is interconnected as a mesh within memory array 11, and connected to each memory cell MC. Instead of the layout of FIG. 13, power supply interconnection ARVDD may be independently interconnected for each I/O circuit 13. In the normal operation mode and the resume standby mode, power supply interconnection potential control circuit 50 connects power supply interconnection ARVDD to power supply node VDD to thereby provide the power supply potential to power supply interconnection ARVDD. In the shutdown mode, power supply interconnection potential control circuit 50 disconnects power supply interconnection ARVDD from power supply node VDD to thereby bring power supply interconnection ARVDD into a floating state. The operation of power supply interconnection potential control circuit 50 is controlled by a control signal from operation mode control circuit 20.

Since FIG. 13 is otherwise the same as FIG. 2, the same or corresponding parts are designated by the same reference signs and will not be described repeatedly.

Figure 14:
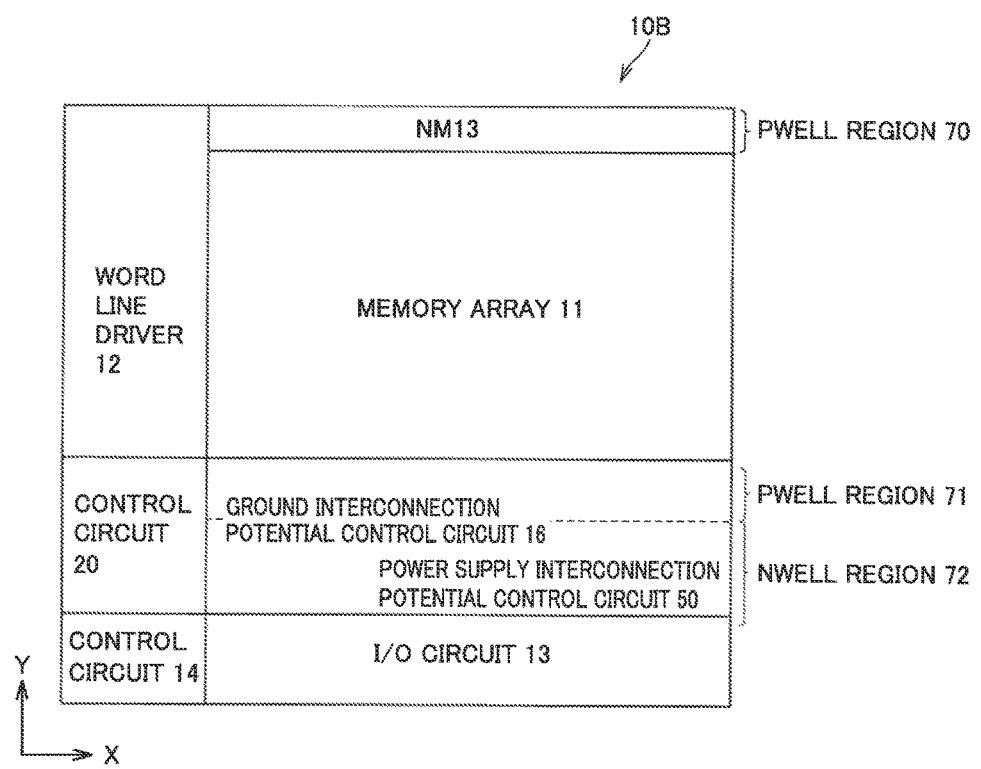
FIG. 14 is a plan view showing a general layout of the SRAM circuit of FIG. 13.
Figure 15:
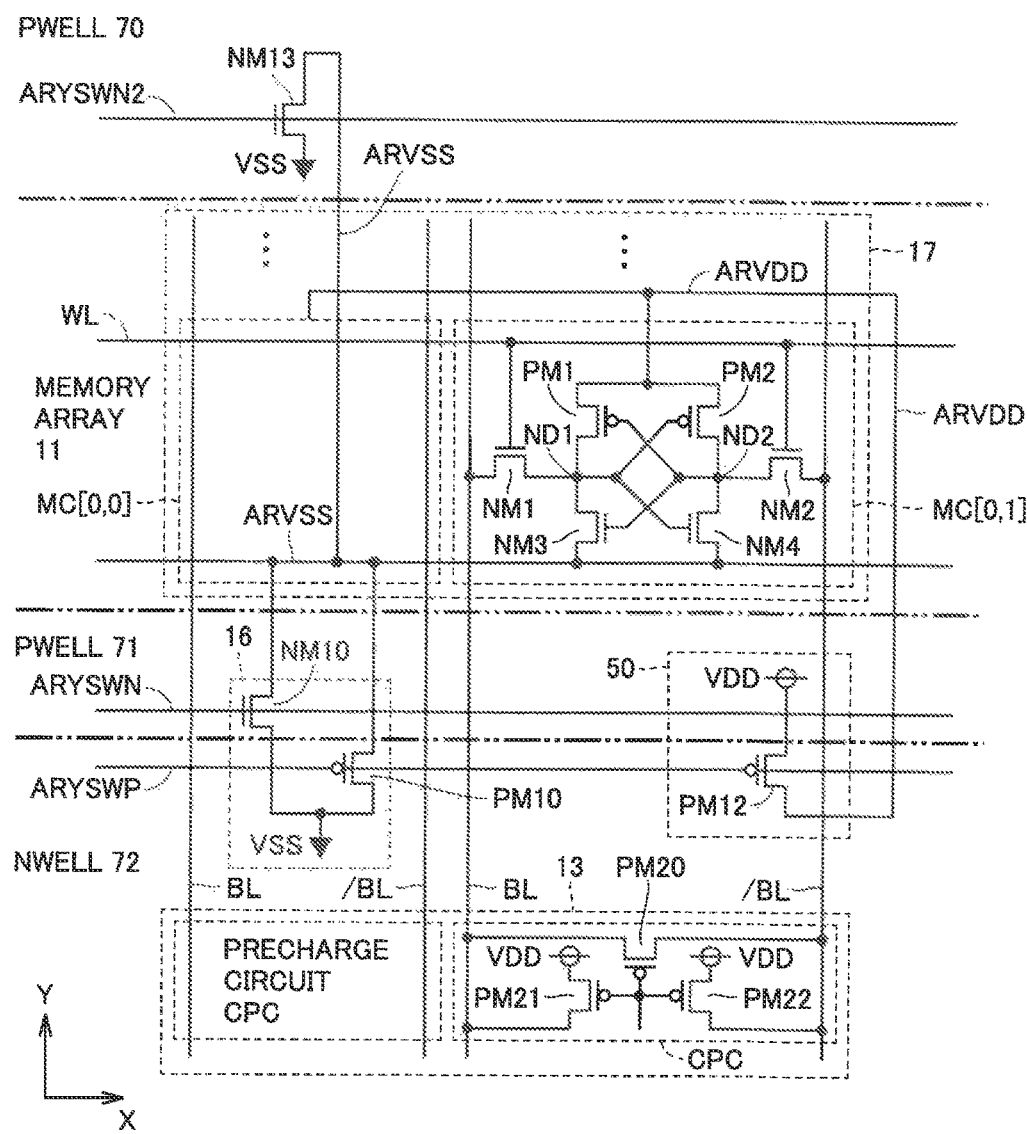
FIG. 15 is a plan view showing a more detailed arrangement of a ground interconnection potential control circuit in the SRAM circuit of FIG. 13.

FIG. 14 is a plan view showing a general layout of the SRAM circuit of FIG. 13 on the substrate. FIG. 15 is a plan view showing a more detailed arrangement of the ground interconnection potential control circuit in the SRAM circuit of FIG. 13. FIG. 15 only shows a portion of SRAM circuit 10B of FIG. 13 that corresponds to one I/O circuit 13. Each one of ground interconnection potential control circuits 16 and each one of power supply interconnection potential control circuits 50 are disposed for each I/O circuit 13.

As was described with reference to FIG. 9, NMOS transistor NM10 forming ground interconnection potential control circuit 16 is formed in P well region 71 extending in the X direction adjacently to the region in which memory array 11 is disposed. PMOS transistor PM10 forming ground interconnection potential control circuit 16 is disposed in N well region 72, which is adjacent to this P well region 71, opposite to memory array 11 (in the −Y direction).

Power supply interconnection potential control circuit 50 includes a PMOS transistor PM12 connected between power supply node VDD and power supply interconnection ARVDD of memory array 11 (memory cell group 17). PMOS transistor PM12 is disposed in the same N well region 72 as PMOS transistor PM10 forming ground interconnection potential control circuit 16. PMOS transistor PM12 has a gate connected to control line ARYSWP common to the gate of PMOS transistor PM10. Accordingly, both PMOS transistors PM10 and PM12 are in an ON state in the normal operation mode and the resume standby mode, and are in an OFF state in the shutdown mode.

Since FIG. 15 is otherwise the same as FIG. 9, the same or corresponding parts are designated by the same reference signs and will not be described repeatedly.

[Configuration Examples Using finFETs]

Configuration examples of PMOS transistors PM10 and PM12 described above using finFETs will be described below.

Figure 16:
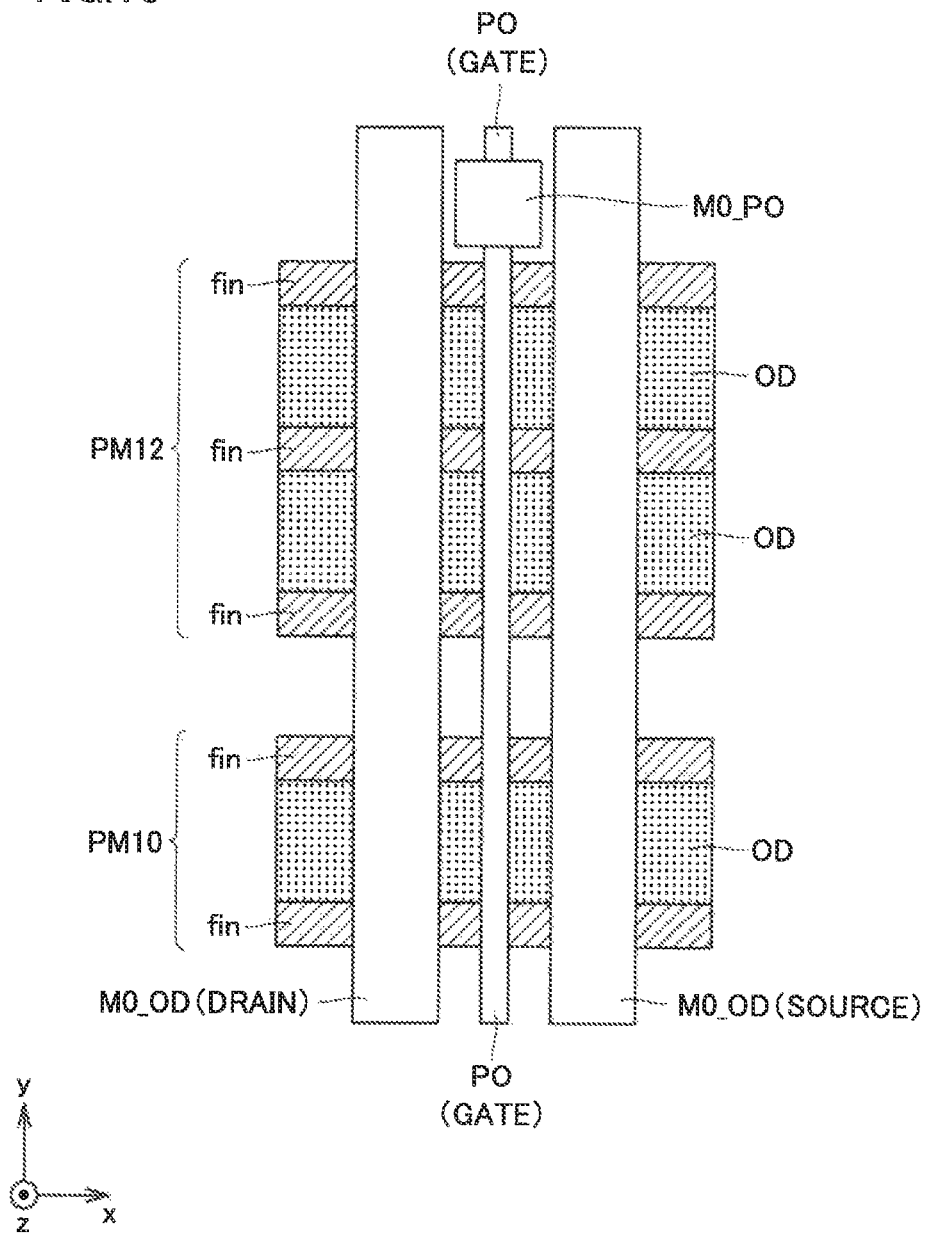
FIG. 16 is a plan view schematically showing the structure of PMOS transistors of FIG. 15 formed using finFETs.
Figure 17:
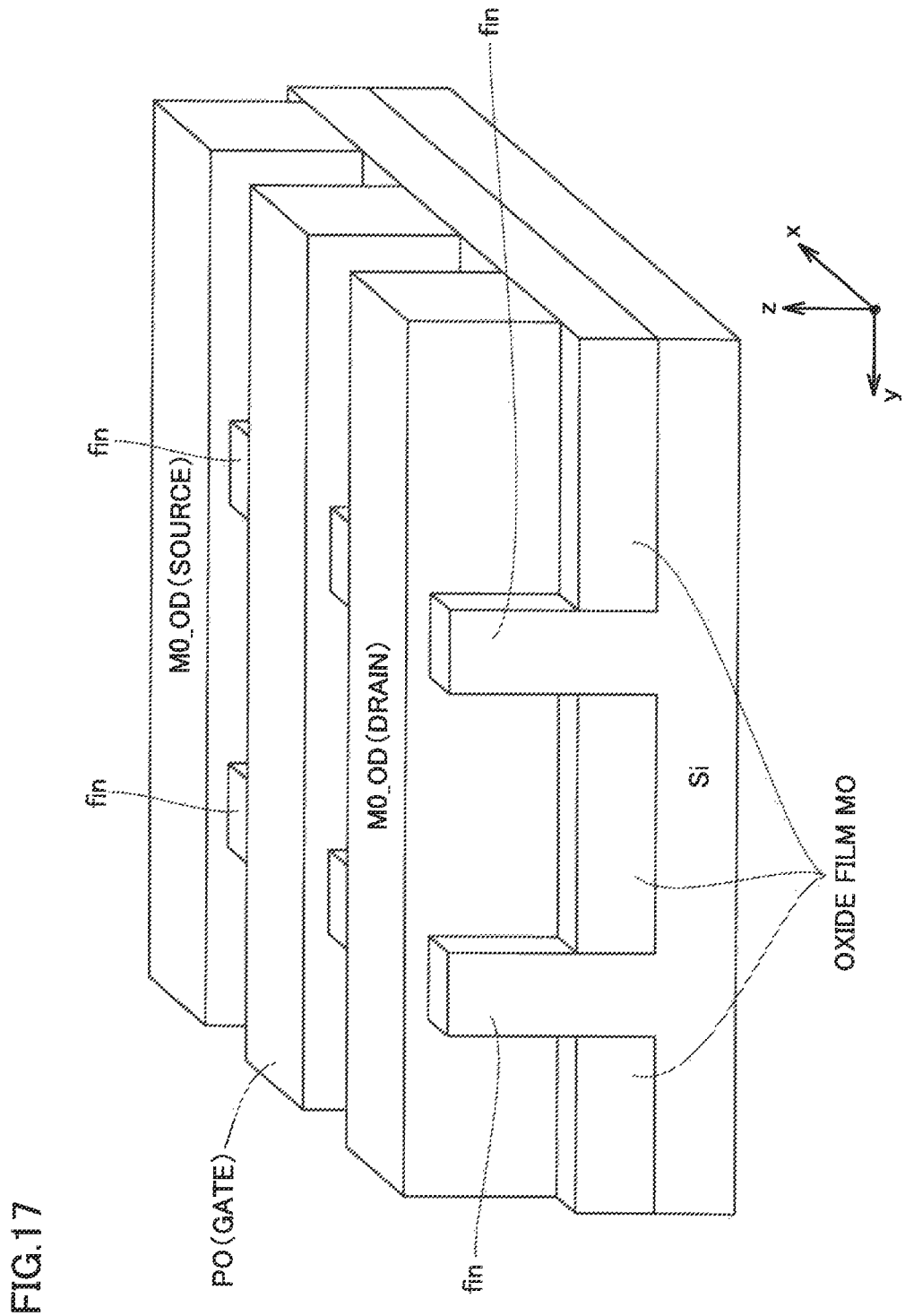
FIG. 17 is a perspective view schematically showing the structure of PMOS transistors of FIG. 15 formed using finFETs.

FIG. 16 is a plan view schematically showing the structure of the PMOS transistors of FIG. 15 formed using finFETs. FIG. 17 is a perspective view schematically showing the structure of the PMOS transistors of FIG. 15 formed using finFETs. End surfaces in the x direction and y direction in FIG. 17 represent cut surfaces.

With reference to FIGS. 16 and 17, a plurality of fins are formed on a silicon substrate (Si). The fins are used as channels of a MOS transistor. The number of fins is determined depending on the required magnitude of a drain current. The surface of the Si substrate not provided with the fins is covered with an oxide film (MO) for interlayer insulation. A gate is formed of polysilicon (PO) so as to stride over the plurality of fins. A gate oxide film is formed in advance between the gate and the fins. The gate is connected to an upper metal interconnection layer (M0_PO). Further, a metal interconnection for drain and a metal interconnection for source (M0_OD) are formed on opposite sides of the gate so as to stride over the plurality of fins.

As described above, PMOS transistor PM10 forming ground interconnection potential control circuit 16 and PMOS transistor PM12 forming power supply interconnection potential control circuit 50 are advantageous in that each of their gates, source lines, and drain lines can be formed of a common single interconnection, thereby saving space.

Figure 18:
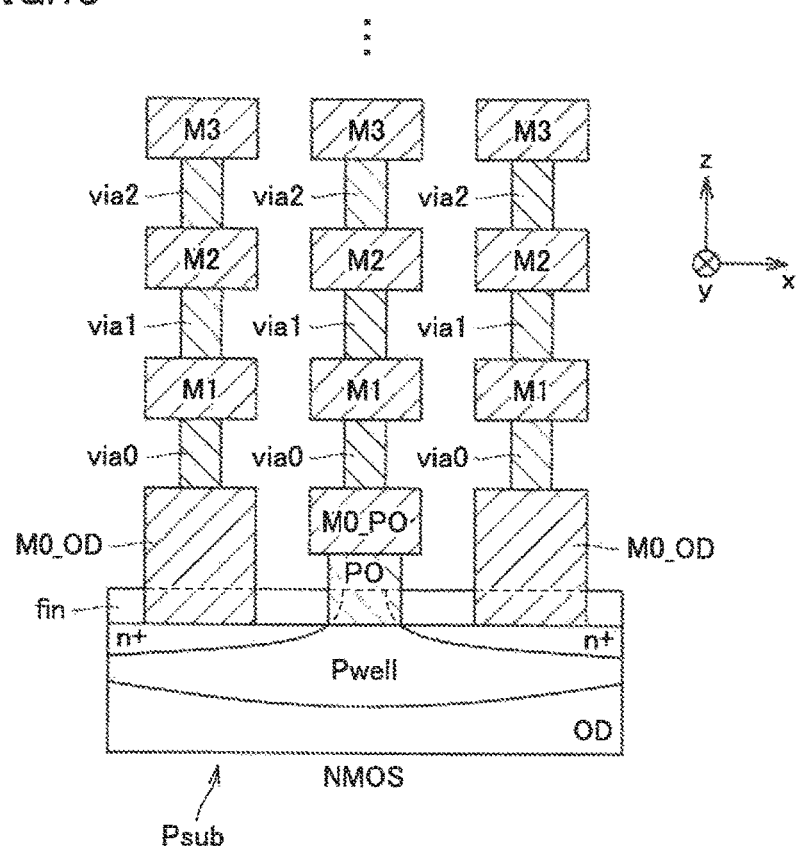
FIG. 18 is a cross-sectional view schematically showing the configuration of an NMOS transistor formed using a finFET.

FIG. 18 is a cross-sectional view schematically showing the configuration of an NMOS transistor formed of a finFET. With reference to FIG. 18, the NMOS transistor is formed in a P well (Pwell) region formed on a P type substrate (Psub). N type (n+) impurity regions (source and drain regions) are formed in the P well. A fin is formed on the P well (Pwell) so as to couple these impurity regions together. A gate is formed of polysilicon (PO), with an interposed gate oxide film, so as to stride over the fin between the source region and the drain region. A metal interconnection layer (M0_PO) is formed on the gate. A metal interconnection layer for source and a metal interconnection layer for drain (M0_OD) are formed on the source region and the drain region (n+). On each of a metal interconnection layer for gate (M0_PO) and the metal interconnection layers for source and drain (M0_OD), metal interconnection layers (M1, M2, M3, . . . ) are successively formed with vias (via0, via1, via2, . . . ) interposed therebetween. Further, it is also possible to employ a method of increasing the drain current by applying strained silicon including silicon germanium or the like to the fin portion.

Figure 19:
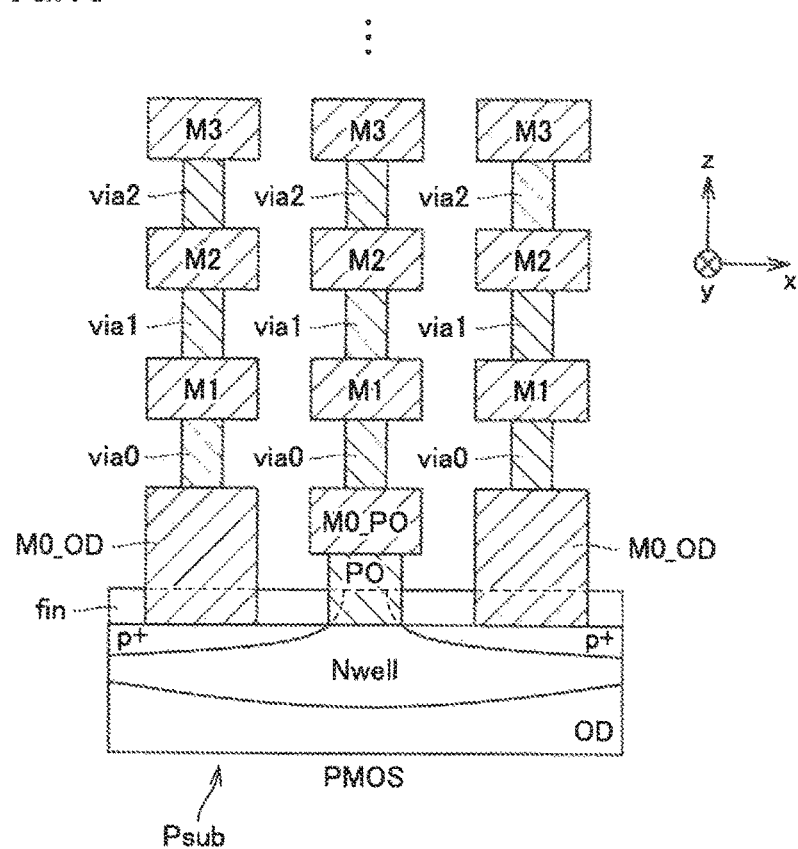
FIG. 19 is a cross-sectional view schematically showing the configuration of a PMOS transistor formed using a finFET.

FIG. 19 is a cross-sectional view schematically showing the configuration of a PMOS transistor formed of a finFET. With reference to FIG. 19, the PMOS transistor is formed in an N well (Nwell) region formed on a P type substrate (Psub). P type (p+) impurity regions (source and drain regions) are further formed in the N well. A fin is formed on the N well (Nwell) so as to couple these impurity regions together.

Since the configuration of the PMOS transistor of FIG. 19 is otherwise the same as the configuration of the NMOS transistor of FIG. 18, the same or corresponding parts are designated by the same reference signs and will not be described repeatedly.

[Effect of Third Embodiment]

The third embodiment provides substantially the same effects as those of the first and second embodiments. Further, the third embodiment is advantageous in area saving because the gate of PMOS transistor PM12 provided to switch the potential of the power supply interconnection of the memory array can be connected to gate control line ARYSWP common to PMOS transistor PM10 forming ground interconnection potential control circuit 16.

<Fourth Embodiment>

A fourth embodiment describes an example where ground interconnection potential control circuit 16 of the first and second embodiments and power supply interconnection potential control circuit 50 of the third embodiment are applied to a dual-port type SRAM circuit having input/output ports of two systems.

[Overall Configuration of Dual-Port Type SRAM Circuit]

Figure 20:
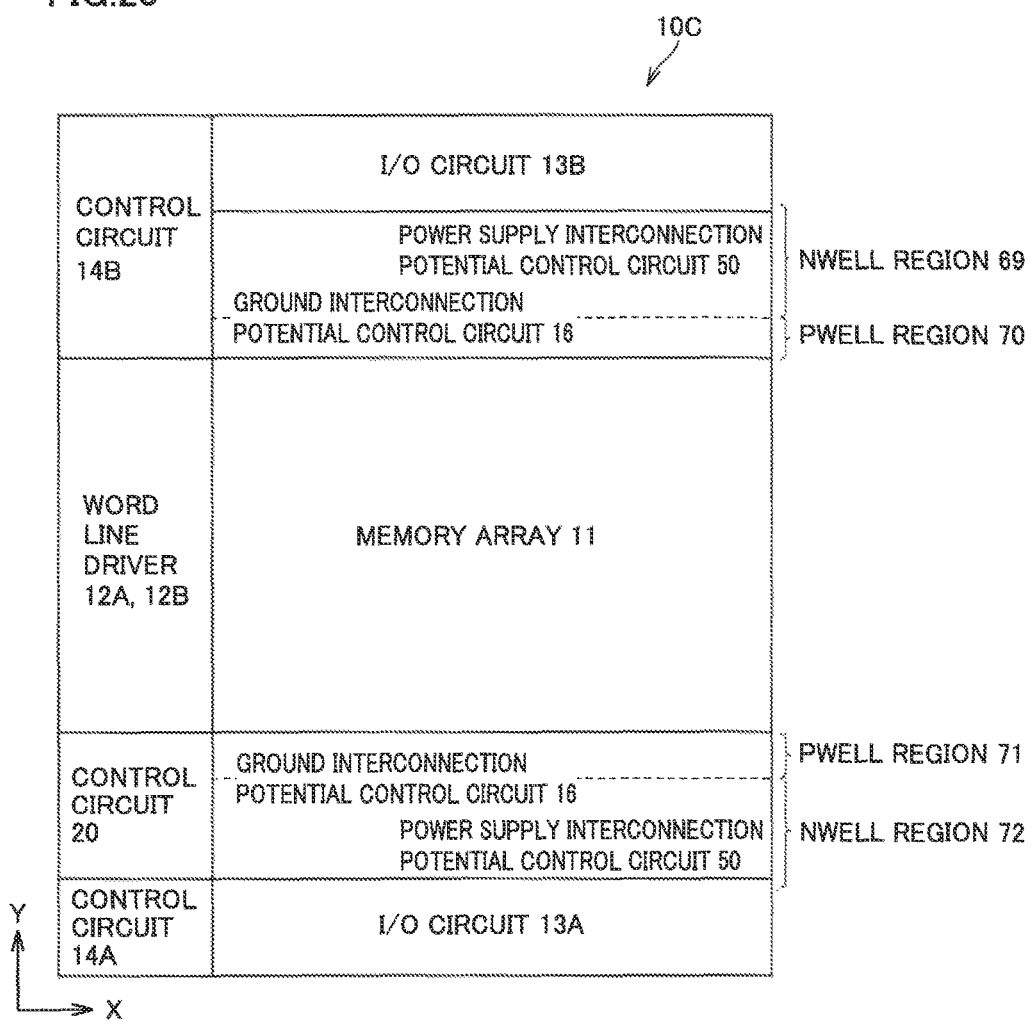
FIG. 20 is a plan view generally showing a layout of the entire dual-port type SRAM circuit.

FIG. 20 is a plan view generally showing a layout of the entire dual-port type SRAM circuit. With reference to FIG. 20, in a dual-port type SRAM circuit 10C, a region in which a plurality of first I/O circuits 13A are provided and a region in which a plurality of second I/O circuits 13B are provided are disposed with memory array 11 interposed therebetween. The plurality of first I/O circuits 13A, memory array 11, and the plurality of second I/O circuits 13B are disposed alongside one another in this order in the column direction (Y direction) of memory array 11. A plurality of word line drivers 12A and 12B are provided adjacent to memory array 11 in the row direction (X direction). The plurality of word line drivers 12A and 12B include first word line drivers 12A used for accessing data from first I/O circuits 13A, and second word line drivers 12B used for accessing data from second I/O circuits 13B. Control circuits 14A for controlling the operation of first I/O circuits 13A are provided adjacent to first I/O circuits 13A in the row direction (−X direction). Further, control circuits 14B for controlling the operation of second I/O circuits 13B are provided adjacent to second I/O circuits 13B in the row direction (−X direction).

Ground interconnection potential control circuit 16 described in the first and second embodiments and power supply interconnection potential control circuit 50 described in the third embodiment are disposed between memory array 11 and the plurality of first I/O circuits 13A, and are disposed between memory array 11 and the plurality of second I/O circuits 13B. Operation mode control circuit 20 is disposed between the region in which the plurality of word line drivers 12A, 12B are disposed and the region in which the plurality of first control circuits 14A are disposed.

[Configuration of Memory Array]

Figure 21:
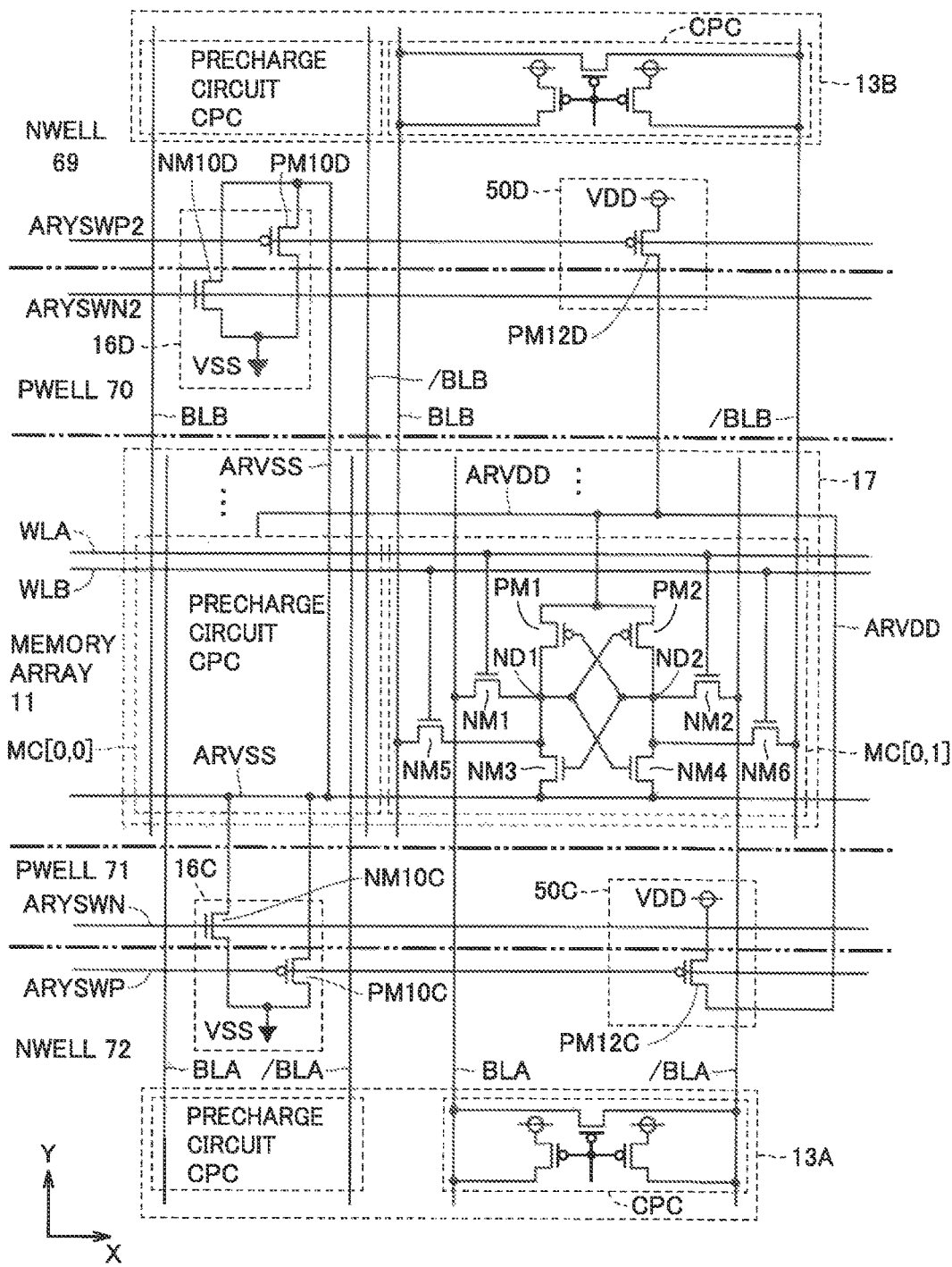
FIG. 21 is a diagram showing a more detailed configuration of the SRAM circuit of FIG. 20.

FIG. 21 is a diagram showing a more detailed configuration of the SRAM circuit of FIG. 20. The configuration diagram of the SRAM circuit of FIG. 21 corresponds to the configuration diagram of FIG. 15, and shows a portion corresponding to one first I/O circuit 13A and one second I/O circuit 13B.

With reference to FIGS. 20 and 21, the dual-port type SRAM circuit includes a first pair of bit lines BLA, /BLA and a second pair of bit lines BLB, /BLB for each column of memory array 11. The first pair of bit lines BLA, /BLA is connected to first I/O circuit 13A, and the second pair of bit lines BLB, /BLB is connected to second I/O circuit 13B. The dual-port type SRAM circuit further includes a first word line WLA and a second word line WLB for each row of memory array 11. First word line WLA is connected to an output node of first word line driver 12A of FIG. 20, and second word line WLB is connected to an output node of second word line driver 12B of FIG. 20.

Each memory cell MC includes: a latch circuit formed of two CMOS inverters; and four transfer NMOS transistors. The connection relation among PMOS transistors PM1, PM2 and NMOS transistors NM1, NM2 forming the latch circuit is the same as that described with reference to FIG. 3, and thus will not be described repeatedly.

Transfer NMOS transistor NM1 is connected between connection node ND1 and bit line BLA, and NMOS transistor NM2 is connected between connection node ND2 and bit line /BLA. NMOS transistors NM1 and NM2 each have a gate connected to common word line WLA. Transfer NMOS transistor NM3 is connected between connection node ND1 and bit line BLB, and NMOS transistor NM4 is connected between connection node ND2 and bit line /BLB. NMOS transistors NM3 and NM4 each have a gate connected to common word line WLB.

[Arrangement of Ground Interconnection Potential Control Circuit and Power Supply Interconnection Potential Control Circuit]

In the following description, as shown in FIG. 21, a ground interconnection potential control circuit and a power supply interconnection potential control circuit disposed between memory array 11 and first I/O circuit 13A are denoted by reference signs 16C and 50C, respectively. A ground interconnection potential control circuit and a power supply interconnection potential control circuit disposed between memory array 11 and second I/O circuit 13B are denoted by reference signs 16D and 50D, respectively.

With reference to FIGS. 20 and 21, more specifically, an NMOS transistor NM10C forming ground interconnection potential control circuit 16C closer to first I/O circuit 13A is formed in P well region 71 extending in the X direction adjacently to the region in which memory array 11 is disposed. NMOS transistor NM10C has a gate connected to control line ARYSWN. A PMOS transistor PM10C forming ground interconnection potential control circuit 16C is disposed in N well region 72, which is adjacent to this P well region 71, opposite to memory array 11 (in the −Y direction). A PMOS transistor PM12C forming power supply interconnection potential control circuit 50C is disposed in the same N well region 72 as PMOS transistor PM10C forming ground interconnection potential control circuit 16C. PMOS transistor PM12C has a gate connected to control line ARYSWP common to the gate of PMOS transistor PM10C. Precharge circuit CPC provided in first I/O circuit 13A is also formed in N well region 72 in which PMOS transistors PM10C and PM12C are disposed.

Similarly, an NMOS transistor NM10D forming ground interconnection potential control circuit 16D closer to second I/O circuit 13B is formed in P well region 70 extending in the X direction adjacently to the region in which memory array 11 is disposed. An NMOS transistor NM10B has a gate connected to control line ARYSWN2. A PMOS transistor PM10D forming ground interconnection potential control circuit 16D is disposed in an N well region 69, which is adjacent to this P well region 70, opposite to memory array 11 (in the +Y direction). A PMOS transistor PM12D forming power supply interconnection potential control circuit 50D is disposed in the same N well region 69 as PMOS transistor PM10D forming ground interconnection potential control circuit 16D. PMOS transistor PM12D has a gate connected to a control line ARYSWP2 common to the gate of PMOS transistor PM10D. Precharge circuit CPC provided in first I/O circuit 13B is also formed in N well region 69 in which PMOS transistors PM10D and PM12D are disposed.

Operation mode control circuit 20 supplies a common control signal to control lines ARYSWN and ARYSWN2, and supplies a common control signal to control lines AYRSWP and ARYSWP2. The logical levels of the control signals in each operation mode are the same as those described with reference to FIG. 5 and the like, and thus will not be described repeatedly.

[Effect of Fourth Embodiment]

In this manner, ground interconnection potential control circuit 16 and power supply interconnection potential control circuit 50 described in the first to third embodiments can also be applied to a dual-port type SRAM circuit. Accordingly, the semiconductor device of the fourth embodiment provides substantially the same effects as those of the semiconductor devices of the first to third embodiments.

Although the invention made by the present inventors has been specifically described based on the embodiments, it goes without saying that the present invention is not limited to the embodiments described above, but can be modified in various ways within a scope that does not depart from the gist of the present invention. In particular, the terms such as MOS (Metal Oxide Semiconductor) are commonly used, and they, of course, do not indicate that the material and the like thereof are limited to metal, oxide and the like.

REFERENCE SIGNS LIST 10, 10A, 10B, 10C SRAM circuit; 11 memory array; 12, 12A, 12B word line driver, 13, 13A, 13B I/O circuit; 14, 14A, 14B control circuit & address decoder, 16, 16A ground interconnection potential control circuit; 17 memory cell group; 20, 20A operation mode control circuit; 50 power supply interconnection potential control circuit; 100 semiconductor substrate; 101 CPU; ARVDD power supply interconnection; ARVSS ground interconnection; ARYSWN, ARYSWN2, ARYSWP control line; BL, BLA, BLB, /BL, /BLA, /BLB bit line; CPC precharge circuit; MC memory cell; NM10 to NM13 NMOS transistor; PM10 to PM12, PM20 to PM22 PMOS transistor, RS, SD control signal; VDD power supply node; VSS ground node; WL, WLA, WLB word line.

The invention claimed is:

1. A semiconductor device, comprising:
 a Static Random Access Memory (SRAM) circuit having a first operation mode and a second operation mode, wherein the SRAM circuit includes:
  a first pair of bit lines extended in a first direction;
  a first word line extended in a second direction crossing the first direction;
  a memory cell electrically connected to the first pair of bit limes and the first word line,
  a latch circuit included in the memory cell;
  a first wiring electrically connected to the latch circuit and supplying a first potential to the latch circuit;
  a second wiring electrically connected to the latch circuit and supplying a second potential lower than the first potential; and
  a first potential control circuit electrically connected to the memory cell via the second wiring,
 wherein the latch circuit comprises a first CMOS inverter and a second CMOS inverter, wherein the first potential control circuit includes:
a first NMOS transistor electrically connected between the second wiring and a third wiring which supplies a third potential lower than the second potential; and
a first PMOS transistor electrically connected between the second wiring and the third wiring in parallel with the first NMOS transistor, and
wherein, in the second operation mode, a gate electrode of the first NMOS transistor and a drain electrode of the first NMOS transistor are electrically connected to each other via the first wiring.

2. The semiconductor device according to claim 1, wherein the SRAM circuit further includes an operation mode control circuit controlling an operation of the first potential control circuit, and
wherein the operation mode control circuit controls the first NMOS transistor to be in an ON state in the first operation mode, and controls the first NMOS transistor to be in a diode-connected state in the second operation mode.

3. The semiconductor device according to claim 2, wherein the operation mode control circuit further includes a second NMOS transistor electrically connected between the second wiring and the third wiring, and
wherein, in the second operation mode, the gate electrode of the first NMOS transistor and the second wiring are electrically connected to each other via the second NMOS transistor.

4. The semiconductor device according to claim 2, further comprising a first control line electrically connected to the gate electrode of the first NMOS transistor,
wherein a gate electrode of the first PMOS transistor is electrically connected to the third wiring, and
wherein the operation mode control circuit includes:
a second NMOS transistor electrically coupled between the first control line and the second wiring; and
a second PMOS transistor electrically connected between the first control line and a fourth wiring supplying a fourth potential higher than the first potential, and
wherein the operation mode control circuit is configured to:
in the first operation mode, control the second NMOS transistor to be in an OFF state and the second PMOS transistor to be in an ON state; and
in the second operation mode, control the second NMOS transistor to be in an ON state and the second PMOS transistor to be in an OFF state.

5. The semiconductor device according to claim 1, wherein each of the first NMOS transistor and the first PMOS transistor comprises a finFET.

6. A semiconductor device, comprising:
a Static Random Access Memory (SRAM) circuit having a first operation mode and a second operation mode,
wherein the SRAM circuit includes:
a plurality of first pair of bit lines extended in a first direction;
a plurality of second pair of bit lines extended in the first direction;
a plurality of first word lines extended in a second direction crossing the first direction;
a plurality of second word lines extended in the second direction;
a plurality of memory cells each connected to the first pair of bit lines, the second pair of bit lines, the first word line, and the second word line;
a first CMOS inverter and a second CMOS inverter included in each of the plurality of memory cells and forming a latch circuit;
a memory array in which the plurality of memory cells are arranged a matrix;
a first wiring electrically connected to the plurality of memory cells and supplying the plurality of memory cells with a first potential;
a second wiring electrically connected to the plurality of memory cells and supplying the plurality of memory cells with a second potential lower than the first potential;
a second wiring potential control circuit electrically connected to the plurality of memory cells via the second wiring; and
a third wiring potential control circuit electrically connected to the plurality of memory cells via the second wiring,
wherein each of the second wiring potential control circuit and the third wiring potential control circuit includes:
a first NMOS transistor electrically connected between the second wiring and a third wiring supplying a third potential lower than the second potential; and
a first PMOS transistor electrically connected between the second wiring and the third wiring in parallel with the first NMOS transistor,
wherein a gate electrode of the first NMOS transistor and a drain electrode of the first NMOS transistor are electrically connected to each other via the second wiring,
wherein the first pair of bit lines are electrically connected to a first Input/Output (I/O) circuit which reads data from a selected memory cell and writing data to a selected memory cell,
wherein the second pair of bit lines is electrically connected to a second I/O circuit which reads data from a selected memory cell and writing data to a selected memory cell,
wherein, in a plan view, the first I/O circuit and the second I/ circuit are disposed in opposite sides with the memory array in the second direction,
wherein, in the plan view, the second wiring potential control circuit is disposed between the memory array and the first I/O circuit in the second direction, and
wherein, in the plan view, the third wiring potential control circuit is disposed between the memory array and the second I/O circuit in the second direction.

7. The semiconductor device according to claim 6, further comprising:
a P well region disposed adjacent to the memory array and extended in the second direction; and
an N well region disposed adjacent to the P well region in the first direction in the plan view, and extended in the first direction,
wherein the N well region is disposed on an opposite side to the memory array with the P well region in the first direction,
wherein the first PMOS transistor is disposed in the N well region, and
wherein the first NMOS transistor is disposed in the P well region.

8. The semiconductor device according to claim 7, wherein each of the first NMOS transistor and the first PMOS transistor comprises a finFET.

* * * * *